United States Patent
Xiao

(10) Patent No.: US 11,107,834 B2
(45) Date of Patent: *Aug. 31, 2021

(54) STAIRCASE AND CONTACT STRUCTURES FOR THREE-DIMENSIONAL MEMORY

(71) Applicant: Yangtze Memory Technologies Co., Ltd., Hubei (CN)

(72) Inventor: Li Hong Xiao, Hubei (CN)

(73) Assignee: Yangtze Memory Technologies Co., Ltd., Hubei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/002,076

(22) Filed: Aug. 25, 2020

(65) Prior Publication Data

US 2020/0388635 A1 Dec. 10, 2020

Related U.S. Application Data

(63) Continuation of application No. 16/422,539, filed on May 24, 2019, now Pat. No. 10,797,075, which is a (Continued)

(51) Int. Cl.
*H01L 27/11582* (2017.01)
*H01L 21/28* (2006.01)
(Continued)

(52) U.S. Cl.
CPC .. *H01L 27/11582* (2013.01); *H01L 21/31144* (2013.01); *H01L 21/76224* (2013.01);
(Continued)

(58) Field of Classification Search
CPC .................. H01L 24/72; H01L 25/071; H01L 2924/10254; H01L 2924/10272;
(Continued)

(56) References Cited

U.S. PATENT DOCUMENTS 9,099,566 B2 8/2015 Kwon et al.
10,074,667 B1 9/2018 Higashi et al.
(Continued)

FOREIGN PATENT DOCUMENTS

CN 102915955 A 2/2013
CN 103681680 A 3/2014
(Continued)

OTHER PUBLICATIONS

International Search Report and Written Opinion of the International Searching Authority directed to related International Patent Application No. PCT/CN2018/119674, dated Sep. 10, 2019; 11 pages.

*Primary Examiner* — Zandra V Smith
*Assistant Examiner* — Andre C Stevenson
(74) *Attorney, Agent, or Firm* — Sterne, Kessler, Goldstein & Fox P.L.L.C.

(57) ABSTRACT

Embodiments of staircase and contact structures of a three-dimensional (3D) memory device and fabrication method thereof are disclosed. The 3D memory device includes a semiconductor substrate and a plurality of through-substrate-trenches penetrating the semiconductor substrate. The 3D memory device also includes a film stack disposed on a first surface of the semiconductor substrate extending through the through-substrate-trenches to a second surface of the semiconductor substrate, wherein the film stack includes alternating conductive and dielectric layers. The 3D memory device also includes a staircase structure formed at an edge of the film stack.

20 Claims, 16 Drawing Sheets

Related U.S. Application Data continuation of application No. PCT/CN2018/119674, filed on Dec. 7, 2018.

(51) Int. Cl.
*H01L 21/311* (2006.01)
*H01L 21/762* (2006.01)
*H01L 23/522* (2006.01)
*H01L 27/11565* (2017.01)
*H01L 27/1157* (2017.01)
*H01L 27/11573* (2017.01)

(52) U.S. Cl.
CPC ...... *H01L 23/5226* (2013.01); *H01L 27/1157* (2013.01); *H01L 27/11565* (2013.01); *H01L 27/11573* (2013.01); *H01L 29/40117* (2019.08)

(58) Field of Classification Search
CPC ..... H01L 2924/1033; H01L 2924/1203; H01L 2924/13055
See application file for complete search history.

(56) References Cited

U.S. PATENT DOCUMENTS

| | | | |
|---|---|---|---|
| 10,256,245 | B2 | 4/2019 | Ariyoshi |
| 2014/0071758 | A1 | 3/2014 | Maejima |
| 2014/0241026 | A1 | 8/2014 | Tanzawa |
| 2019/0139974 | A1* | 5/2019 | Sugawara ........... H01L 21/8239 |
| 2019/0386108 | A1* | 12/2019 | Nishikawa ........ H01L 27/11556 |
| 2020/0185410 | A1 | 6/2020 | Xiao |

FOREIGN PATENT DOCUMENTS

| | | |
|---|---|---|
| CN | 108493192 A | 9/2018 |
| CN | 108550575 A | 9/2018 |
| CN | 108649033 A | 10/2018 |
| CN | 108886040 A | 11/2018 |
| JP | 2018/152419 A | 9/2018 |

\* cited by examiner

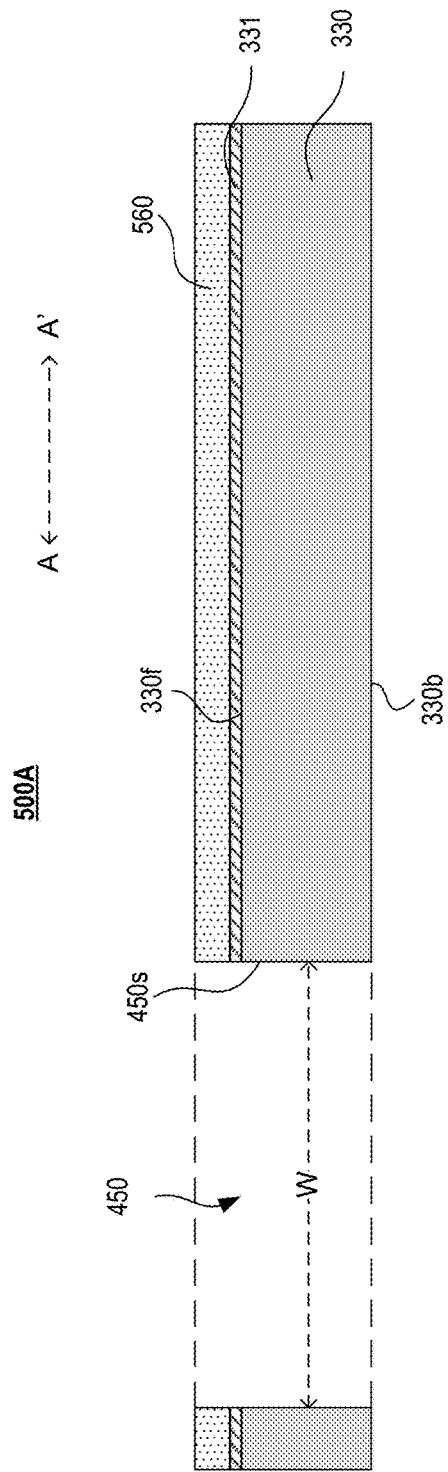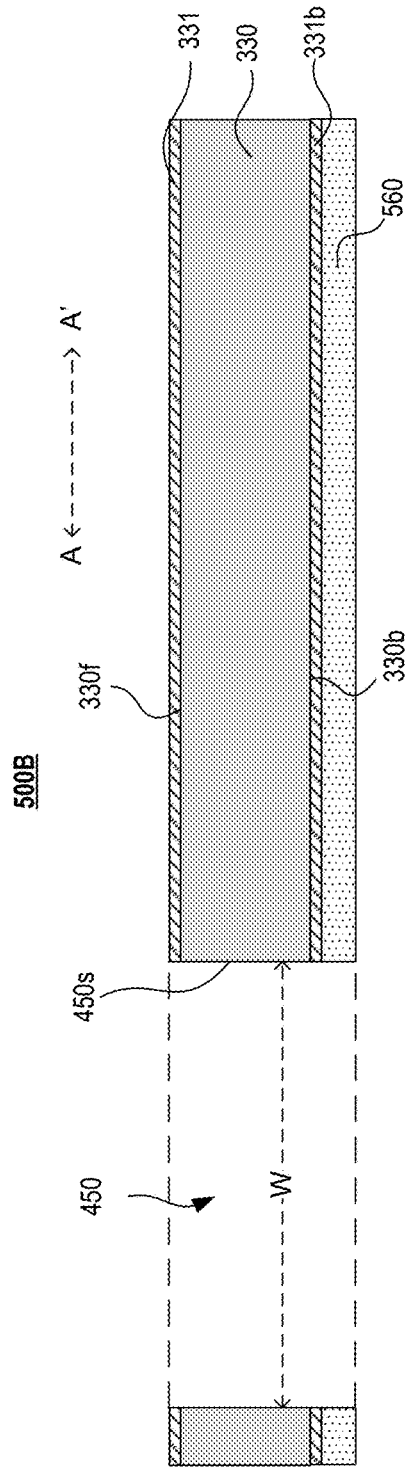

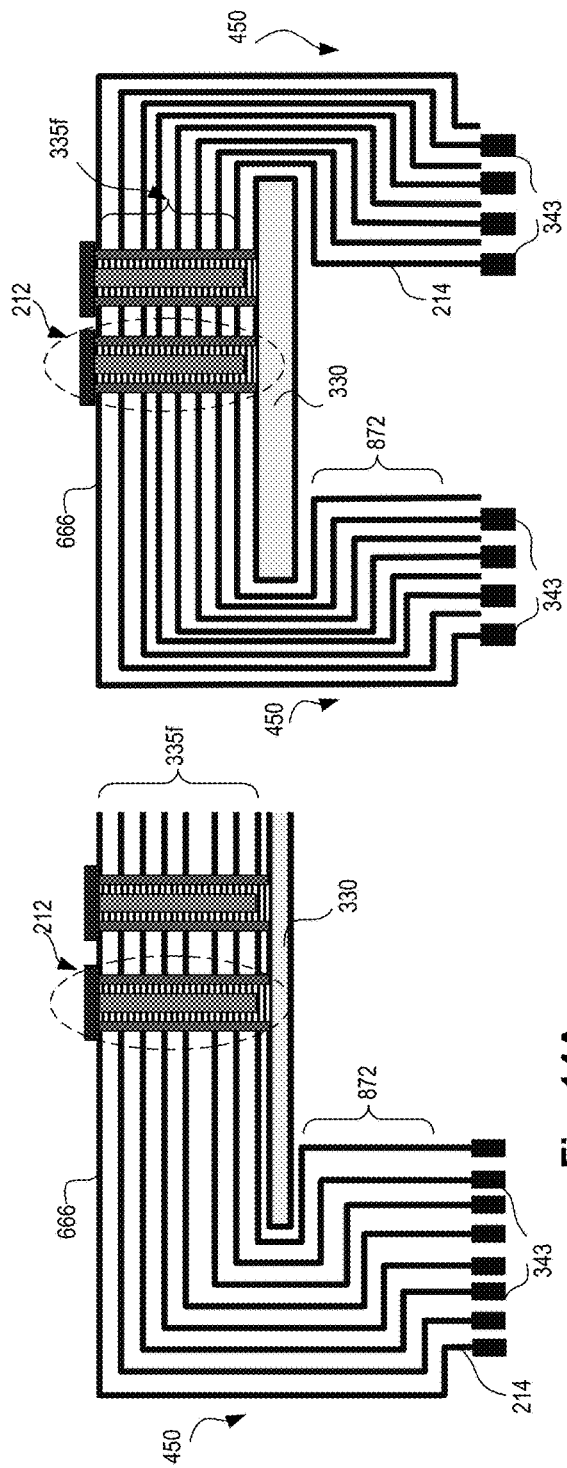
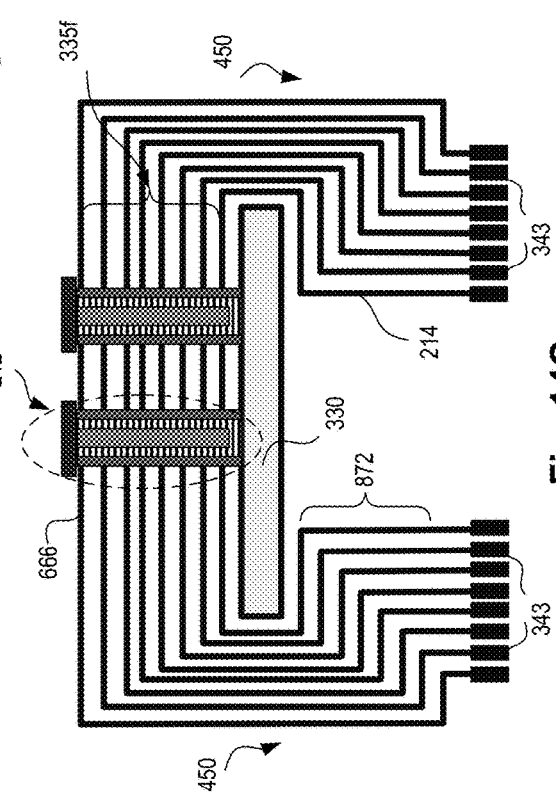
Fig. 14A
Fig. 14B
Fig. 14C

STAIRCASE AND CONTACT STRUCTURES FOR THREE-DIMENSIONAL MEMORY

CROSS-REFERENCE TO RELATED APPLICATIONS AND INCORPORATION BY REFERENCE

This application is a continuation of U.S. non-provisional patent application Ser. No. 16/422,539 filed on May 24, 2019 and titled "Staircase And Contact Structures For Three-Dimensional Memory," which claims priority to PCT/CN2018/119674 filed on Dec. 7, 2018, both of which are incorporated herein by reference in their entireties.

TECHNICAL FIELD

The present disclosure generally relates to the field of semiconductor technology, and more particularly, to a method for forming a three-dimensional (3D) memory.

BACKGROUND

Planar memory cells are scaled to smaller sizes by improving process technology, circuit designs, programming algorithms, and the fabrication process. However, as feature sizes of the memory cells approach a lower limit, planar process and fabrication techniques become challenging and costly. As such, memory density for planar memory cells approaches an upper limit. A three-dimensional (3D) memory architecture can address the density limitation in planar memory cells.

BRIEF SUMMARY

Embodiments of staircase and contact structures for a three-dimensional memory device and methods for forming the same are described in the present disclosure.

In some embodiments, a three-dimensional (3D) memory device includes a semiconductor substrate and a plurality of through-substrate-trenches penetrating the semiconductor substrate. The 3D memory device also includes a film stack disposed on a first surface of the semiconductor substrate extending through the through-substrate-trenches to a second surface of the semiconductor substrate, wherein the film stack includes alternating conductive and dielectric layers. The 3D memory device also includes a staircase structure formed at an edge of the film stack.

In some embodiments, the memory device further includes a plurality of memory strings extending through the film stack on the first surface of the semiconductor substrate, and the staircase structure formed on the second surface of the semiconductor substrate, wherein the first and second surfaces are on opposite sides of the semiconductor substrate.

In some embodiments, the memory device further includes peripheral devices on the first surface of the semiconductor substrate.

In some embodiments, the memory device further includes peripheral devices on the second surface of the semiconductor substrate.

In some embodiments, the memory device further includes peripheral devices on a different semiconductor substrate and electrically connected with the memory strings and the staircase structure by wafer bonding or flip-chip bonding.

In some embodiments, the film stack on the first and second surfaces is stacked in a first direction perpendicular to the first and second surfaces of the semiconductor substrate, respectively, and the film stack inside the through-substrate-trench stacked in a second direction perpendicular to a sidewall of the through-substrate-trench.

In some embodiments, the staircase structure includes conductive layers, each terminating at a different length in a horizontal direction to allow electrical connection to each of the conductive layers. In some embodiments, the memory device further includes a plurality of contact structures formed in an insulating layer over the staircase structure, wherein the contact structures are formed on the conductive layers of the staircase structures.

In some embodiments, the memory device further includes a plurality of first and second slit structures formed in the film stack on the first and second surfaces of the semiconductor substrate, respectively, wherein the first and second slit structures extend vertically through the film stack and are configured to divide a memory block into a plurality of programmable and readable memory fingers.

In some embodiments, the through-substrate-trench includes a trench filling structure, wherein the trench filling structure includes an insulator.

In some embodiments, the staircase structure is formed at one edge of the film stack. In some embodiments, each conductive layer of the staircase structure is connected to a metal interconnect line.

In some embodiments, the staircase structure is formed on each of the two edges of the film stack. In some embodiments, each conductive layer of each staircase structure is connected to a metal interconnect line, and the two corresponding conductive layers of the two staircase structures are connected to the same metal interconnect line. In some embodiments, odd conductive layers of one staircase structure and even conductive layers of the other staircase structure are connected to metal interconnect lines.

In some embodiments, the conductive layers of the film stack include poly-crystalline silicon.

In some embodiments, the dielectric layers of the film stack include silicon oxide, silicon oxynitride or silicon nitride.

Another aspect of the present disclosure provides a method for forming a three-dimensional (3D) memory device. A method for forming a three-dimensional (3D) memory device includes disposing an insulating film on a first surface of a substrate, and forming a plurality of through-substrate-trenches extending through the insulating film and the substrate. The method also includes disposing a film stack of alternating conductive and dielectric layers on the first surface and a second surface of the substrate, wherein the first and second surfaces are on opposite sides of the substrate. The method further includes forming trench filling structures inside the through-substrate-trenches, and forming a staircase structure on an edge of the film stack on the second surface of the substrate. The method also includes disposing an insulating layer on the staircase structure, and forming a plurality of memory strings in the film stack on the first surface of the substrate. The method includes forming a plurality of first and second slit structures in the film stack on the first and second surfaces, respectively, to divide a memory block into a plurality of programmable and readable memory fingers. The method also includes forming contact structures on the conductive layers of the staircase structure.

In some embodiments, the disposing of the film stack further includes disposing the alternating conductive and dielectric layers inside the through-substrate-trenches.

In some embodiments, the forming of the staircase structure includes removing a portion of each conductive and dielectric layer pair at a different length in a horizontal direction over the second surface of the substrate to allow electrical connections to each of the conductive layers.

In some embodiments, the forming of the first and second slit structures includes etching the film stack of alternating conductive and dielectric layers on the first and second surfaces of the substrate to form a plurality of first and second slit openings. The forming of the first and second slit structures also includes disposing a slit filling material in the plurality of the first and second slit openings on respective ones of the first and second surfaces of the substrate, and forming coplanar surfaces between the slit filling material and the film stack on the first and second surfaces.

In some embodiments, the slit filling material includes an insulator such as silicon oxide, silicon oxynitride or silicon nitride.

In some embodiments, the first slit structure further includes a conductive core surrounded by an insulator, configured to function as a common source contact for the memory strings.

In some embodiments, the forming of the trench filling structures includes disposing a polish-stopping layer at least on the film stack on the second surface of the substrate, and disposing a trench filling material inside the through-substrate-trenches. The forming of the trench filling structures also includes forming coplanar surfaces between the trench filling material and the film stack on the first and second surfaces of the substrate.

In some embodiments, the trench filling material includes an insulator such as silicon oxide, silicon oxynitride or silicon nitride.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

FIG. 5A-5B illustrate schematic cross-sectional views of an exemplary 3D memory device at certain fabricating stages, according to some embodiments of the present disclosure.

FIG. 14A-14C illustrate schematic cross-sectional views of exemplary 3D memory devices at certain fabricating stages, according to some embodiments of the present disclosure.

Figure 1:
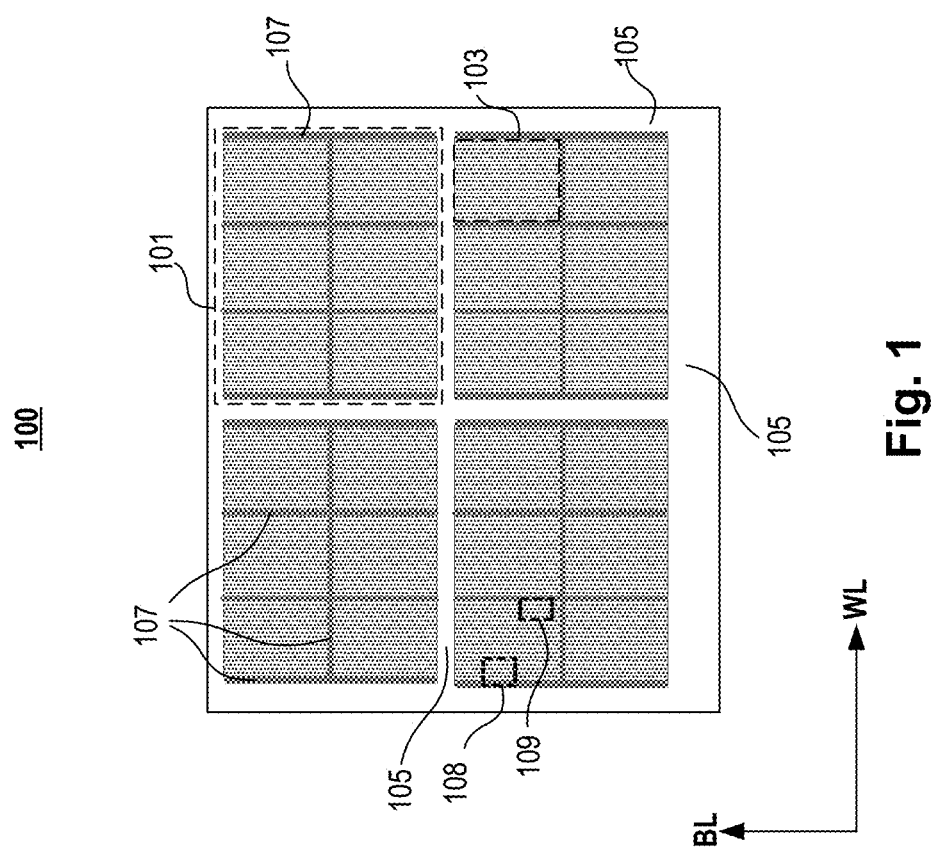
FIG. 1 illustrates a schematic top-down view of an exemplary three-dimensional (3D) memory device, according to some embodiments of the present disclosure.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described can include a particular feature, structure, or characteristic, but every embodiment can not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology can be understood at least in part from usage in context. For example, the term "one or more" as used herein, depending at least in part upon context, can be used to describe any feature, structure, or characteristic in a singular sense or can be used to describe combinations of features, structures or characteristics in a plural sense. Similarly, terms, such as "a," "an," or "the," again, can be understood to convey a singular usage or to convey a plural usage, depending at least in part upon context. In addition, the term "based on" can be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something, but also includes the meaning of "on" something with an intermediate feature or a layer therebetween. Moreover, "above" or "over" not only means "above" or "over" something, but can also include the meaning it is "above" or "over" something with no intermediate feature or layer therebetween (i.e., directly on something).

Further, spatially relative terms, such as "beneath," "below," "lower," "above," "upper," and the like, can be used herein for ease of description to describe one element or feature's relationship to another element(s) or feature(s) as illustrated in the figures. The spatially relative terms are intended to encompass different orientations of the device in use or process step in addition to the orientation depicted in the figures. The apparatus can be otherwise oriented (rotated 90 degrees or at other orientations) and the spatially relative descriptors used herein can likewise be interpreted accordingly.

As used herein, the term "substrate" refers to a material onto which subsequent material layers are added. The substrate includes a top surface and a bottom surface. The top surface of the substrate is typically where a semiconductor device is formed, and therefore the semiconductor device is formed at a top side of the substrate unless stated otherwise. The bottom surface is opposite to the top surface and therefore a bottom side of the substrate is opposite to the top side of the substrate. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer has a top side and a bottom side where the bottom side of the layer is relatively close to the substrate and the top side is relatively away from the substrate. A layer can extend over the entirety of an underlying or overlying structure, or can have an extent less than the extent of an underlying or overlying structure. Further, a layer can be a region of a homogeneous or inhomogeneous continuous structure that has a thickness less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vertical interconnect accesses (VIAs) are formed) and one or more dielectric layers.

As used herein, the term "nominal/nominally" refers to a desired, or target, value of a characteristic or parameter for a component or a process step, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In the present disclosure, the term "horizontal/horizontally/lateral/laterally" means nominally parallel to a lateral surface of a substrate. In the present disclosure, the term "each" may not only necessarily mean "each of all," but can also mean "each of a subset."

As used herein, the term "3D memory" refers to a three-dimensional (3D) semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate.

In the present disclosure, for ease of description, "tier" is used to refer to elements of substantially the same height along the vertical direction. For example, a word line and the underlying gate dielectric layer can be referred to as "a tier," a word line and the underlying insulating layer can together be referred to as "a tier," word lines of substantially the same height can be referred to as "a tier of word lines" or similar, and so on.

In some embodiments, a memory string of a 3D memory device includes a semiconductor pillar (e.g., silicon channel) that extends vertically through a plurality of conductive and dielectric layer pairs. The plurality of conductive and dielectric layer pairs are also referred to herein as an "alternating conductive and dielectric stack." An intersection of the conductive layer and the semiconductor pillar can form a memory cell. The conductive layer of the alternating conductive and dielectric stack can be connected to a word line at the back-end-of-line, wherein the word line can electrically connect to one or more control gates. For illustrative purposes, word lines and control gates are used interchangeably to describe the present disclosure. The top of the semiconductor pillar (e.g., transistor drain region) can be connected to a bit line (electrically connecting one or more semiconductor pillars). Word lines and bit lines are typically laid perpendicular to each other (e.g., in rows and columns, respectively), forming an "array" of the memory, also called a memory "block" or an "array block".

A memory "die" may have one or more memory "planes", and each memory plane may have a plurality of memory blocks. An array block can also be divided into a plurality of memory "pages", wherein each memory page may have a plurality of memory strings. In a flash NAND memory device, erase operation can be performed for every memory block and read/write operation can be performed for every memory page. The array blocks are the core area in a memory device, performing storage functions. To achieve higher storage density, the number of vertical 3D memory stacks is increased greatly, adding complexity and cost in manufacturing.

A memory die has another region, called the periphery, which provides supporting functions to the core. The periphery region includes many digital, analog, and/or mixed-signal circuits, for example, row and column decoders, drivers, page buffers, sense amplifiers, timing and controls, and the like circuitry. Peripheral circuits use active and/or passive semiconductor devices, such as transistors, diodes, capacitors, resistors, etc., as would be apparent to a person of ordinary skill in the art.

Other parts of the memory devices are not discussed for ease of description. In the present disclosure, a "memory device" is a general term and can be a memory chip (package), a memory die or any portion of a memory die.

Although using three-dimensional NAND devices as examples, in various applications and designs, the disclosed structures can also be applied in similar or different semiconductor devices to, e.g., to improve metal connections or wiring. The specific application of the disclosed structures should not be limited by the embodiments of the present disclosure.

FIG. 1 illustrates a top-down view of an exemplary three-dimensional (3D) memory device 100, according to some embodiments of the present disclosure. The 3D memory device 100 can be a memory die and can include one or more memory planes 101, each of which can include a plurality of memory blocks 103. Identical and concurrent operations can take place at each memory plane 101. The memory block 103, which can be megabytes (MB) in size, is the smallest size to carry out erase operations. Shown in FIG. 1, the exemplary 3D memory device 100 includes four memory planes 101 and each memory plane 101 includes six memory blocks 103. Each memory block 103 can include a plurality of memory cells, wherein each memory cell can be addressed through interconnections such as bit lines and word lines. The bit lines and word lines can be laid out perpendicularly, forming an array of metal lines. The direction of bit lines and word lines are labeled as "BL" and "WL" in FIG. 1. In this disclosure, memory blocks 103 is also referred to as "memory arrays".

The 3D memory device 100 also includes a periphery regions 105, an area surrounding memory planes 101. The periphery region 105 contains peripheral circuits to support functions of the memory array, for example, page buffers, row and column decoders and sense amplifiers.

It is noted that, the arrangement of the memory planes 101 in the 3D memory device 100 and the arrangement of the memory blocks 103 in each memory plane 101 illustrated in FIG. 1 are only used as an example, which does not limit the scope of the present disclosure.

The 3D memory device 100 can also include through array contact structures located in the through array contact regions 107 of a memory array. In some embodiments, the memory arrays and the peripheral circuits of the 3D memory device 100 can be formed on different substrates and can be joined together to form the 3D memory device 100 through wafer bonding. In this example, the through array contact structures can provide vertical interconnects between the memory arrays and peripheral circuits, thereby reducing metal levels and shrinking die size. Detailed structure and method of 3D memory with hybrid bonding is described in co-pending U.S. patent application, titled "Hybrid Bonding Contact Structure of Three-Dimensional Memory Device," (application Ser. No. 16/046,852 and filed on Jul. 26, 2018), which is incorporated herein by reference in its entirety.

Figure 2:
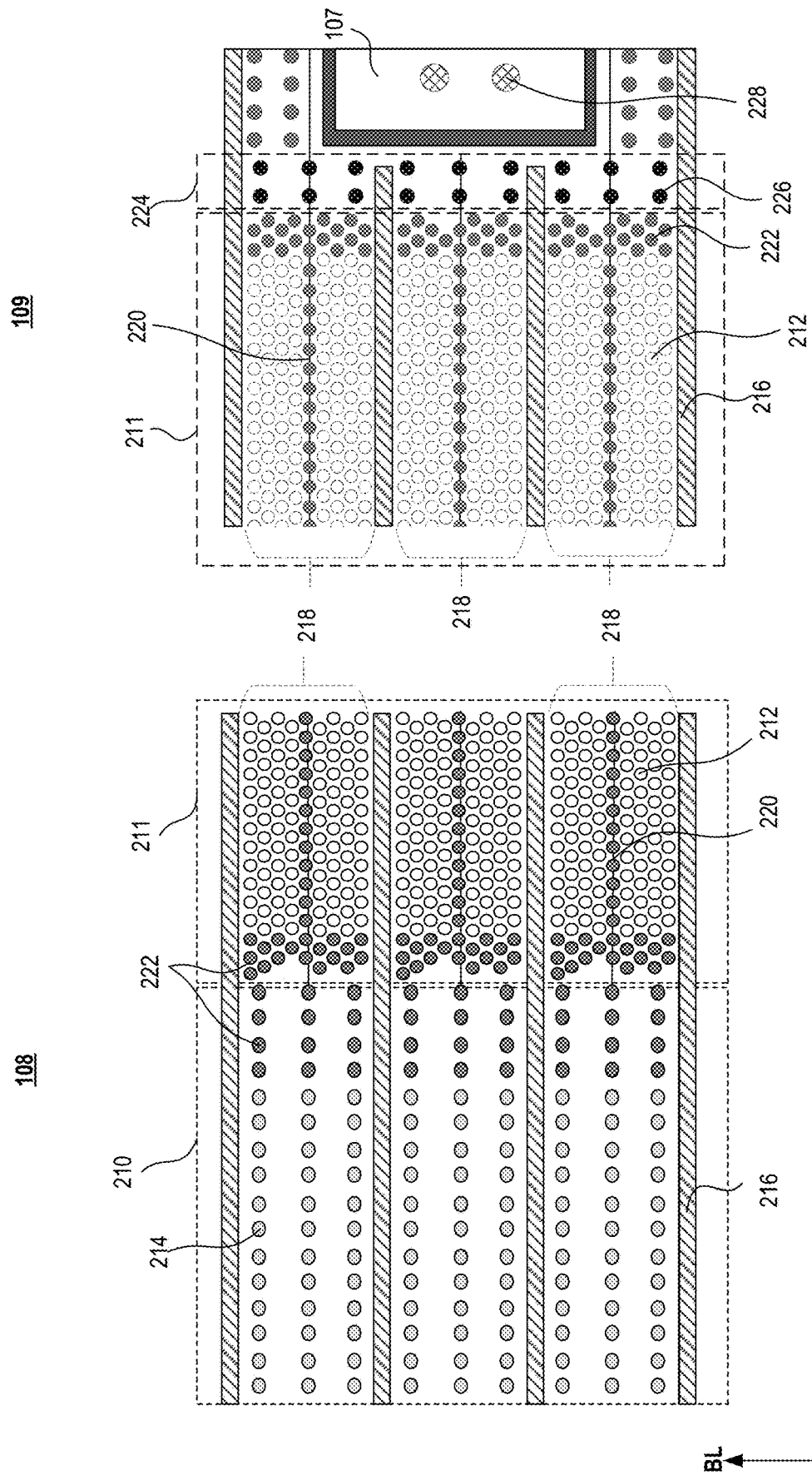
FIG. 2A-2B illustrate schematic top-down views of some regions of an exemplary 3D memory device, according to some embodiments of the present disclosure.

Referring to FIG. 2A, an enlarged top-down view of a region 108 in FIG. 1 is illustrated, according to some embodiments of the present disclosure. The region 108 of the 3D memory device 100 can include a staircase region 210 and a channel structure region 211. The channel structure region 211 can include an array of memory strings 212, each including a plurality of stacked memory cells. The staircase region 210 can include a staircase structure and an array of contact structures 214 formed on the staircase structure. In some embodiments, a plurality of slit structures 216, extending in WL direction across the channel structure region 211 and the staircase region 210, can divide a memory block into multiple memory fingers 218. At least some slit structures 216 can function as the common source contact for an array of memory strings 212 in channel structure regions 211. A top select gate cut 220 can be disposed in the middle of each memory finger 218 to divide a top select gate (TSG) of the memory finger 218 into two portions, and thereby can divide a memory finger into two programmable (read/write) pages. While erase operation of a 3D NAND memory can be carried out at memory block level, read and write operations can be carried out at memory page level. A page can be kilobytes (KB) in size. In some embodiments, region 108 also includes dummy memory strings 222 for process variation control during fabrication and/or for additional mechanical support.

Referring to FIG. 2B, an enlarged top-down view of a region 109 in FIG. 1 is illustrated, according to some embodiments of the present disclosure. The region 109 of the 3D memory device 100 can include the channel structure region 211, the through array contact region 107, and a top select gate (TSG) staircase region 224.

The channel structure region 211 in the region 109 can be similar to the channel structure region 211 in region 108. The TSG staircase region 224 can include an array of TSG contacts 226 formed on the staircase structure. The TSG staircase region 224 can be disposed on the sides of the channel structure region 211 and adjacent to through array contact region 107 in the top-down view. Multiple through array contacts 228 can be formed in the through array contact region 107.

Figure 3:
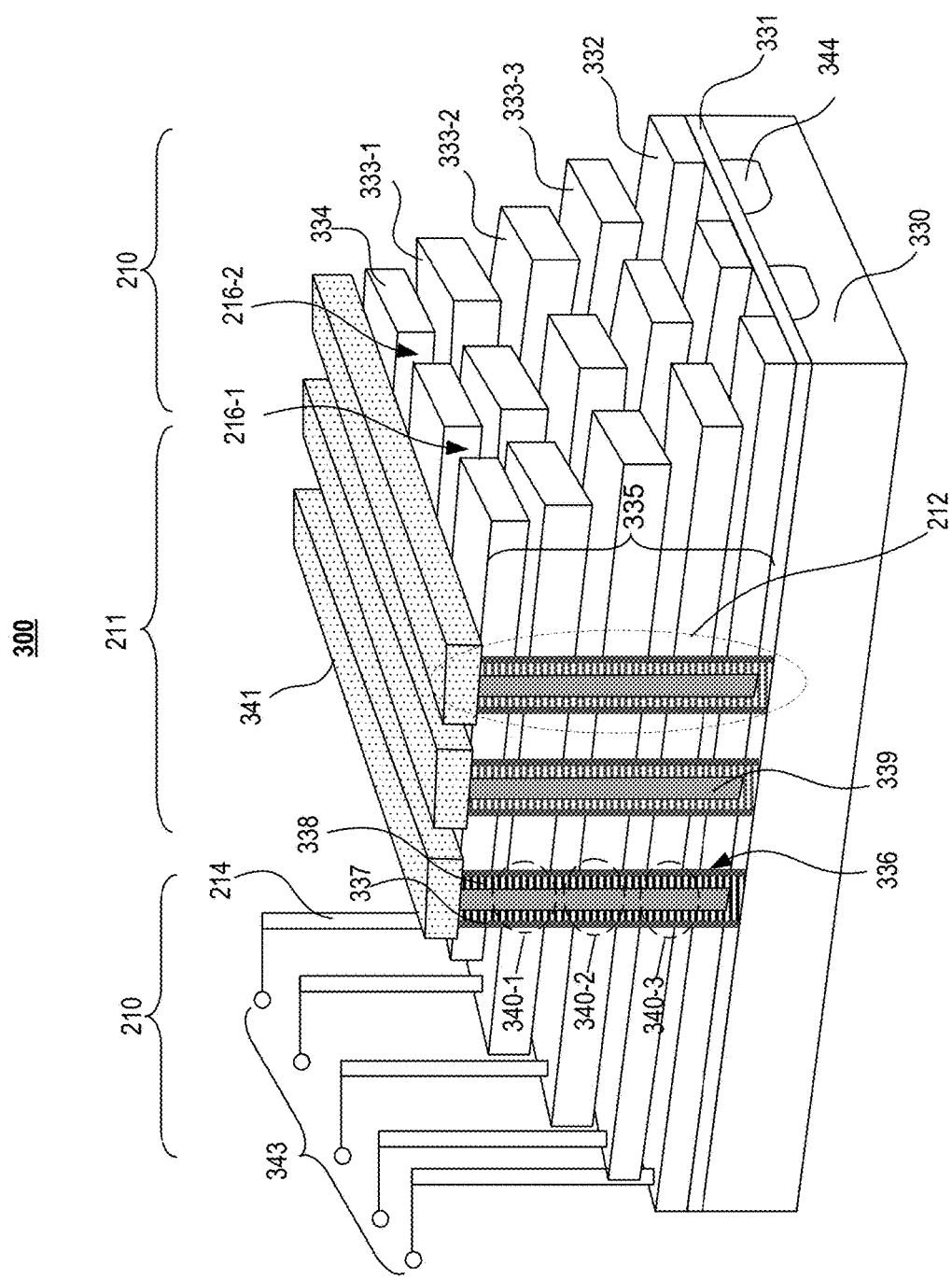
FIG. 3 illustrates a schematic cross-sectional view of an exemplary 3D memory array structure, in accordance with some embodiments of the present disclosure.

FIG. 3 illustrates a perspective view of a portion of an exemplary three-dimensional (3D) memory array structure 300, according to some embodiments of the present disclosure. The memory array structure 300 includes a substrate 330, an insulating film 331 over the substrate 330, a tier of lower select gates (LSGs) 332 over the insulating film 331, and a plurality of tiers of control gates 333, also referred to as "word lines (WLs)", stacking on top of the LSGs 332 to form a film stack 335 of alternating conductive and dielectric layers. The dielectric layers adjacent to the tiers of control gates are not shown in FIG. 3 for clarity.

The control gates of each tier are separated by slit structures 216-1 and 216-2 through the film stack 335. The memory array structure 300 also includes a tier of top select gates (TSGs) 334 over the stack of control gates 333. The stack of TSG 334, control gates 333 and LSG 332 is also referred to as "gate electrodes." The memory array structure 300 further includes memory strings 212 and doped source line regions 344 in portions of substrate 330 between adjacent LSGs 332. Each memory strings 212 includes a channel hole 336 extending through the insulating film 331 and the film stack 335 of alternating conductive and dielectric layers. Memory strings 212 also includes a memory film 337 on a sidewall of the channel hole 336, a channel layer 338 over the memory film 337, and a core filling film 339 surrounded by the channel layer 338. A memory cell 340 can be formed at the intersection of the control gate 333 and the memory string 212. The memory array structure 300 further includes a plurality of bit lines (BLs) 341 connected to the memory strings 212 over the TSGs 334. The memory array structure 300 also includes a plurality of metal interconnect lines 343 connected to the gate electrodes through a plurality of contact structures 214. The edge of the film stack 335 is configured in a shape of staircase to allow an electrical connection to each tier of the gate electrodes. The channel structure region 211 and the staircase region 210 correspond to the channel structure region 211 and the staircase region 210 in the top-down view of FIG. 2A, wherein one of the staircase region 210 in FIG. 3 can be used as TSG staircase region 230 for TSG connection.

In FIG. 3, for illustrative purposes, three tiers of control gates 333-1, 333-2, and 333-3 are shown together with one tier of TSG 334 and one tier of LSG 332. In this example, each memory string 212 can include three memory cells 340-1, 340-2 and 340-3, corresponding to the control gates 333-1, 333-2 and 333-3, respectively. In some embodiments, the number of control gates and the number of memory cells can be more than three to increase storage capacity. The memory array structure 300 can also include other structures, for example, through array contact, TSG cut, common source contact and dummy channel structure. These structures are not shown in FIG. 3 for simplicity.

With the demand for higher storage capacity in a NAND flash memory, the number of vertical tiers of 3D memory cells 340 or word lines 333 increases accordingly, leading to more process complexity and higher manufacturing cost. When increasing the tiers of memory cells 340 or word lines 333 of the memory array structure 300, it becomes more challenging to etch deeper channel holes 336 for the memory strings 212 and also more challenging to form contact structures 214 on the staircase structures. For example, to form the contact structures 214 on a large number of vertically stacked word lines (gate electrodes), a high aspect ratio etching is needed to form contact holes, followed by a high aspect ratio deposition of conductive materials inside the contact holes. To reduce cost per bit for a 3D memory, dimensions of the memory structures are reduced to allow fabrication of more memory blocks on a wafer. However the increased word line stack also leads to wider staircase structures in a horizontal direction parallel to the substrate surface, resulting in a wider staircase region 210 and less storage density.

To alleviate etching and deposition difficulties with more and more vertically stacked word lines, portions of a 3D memory device can be formed on two or more wafers and then joined together through wafer bonding or flip-chip bonding. Alternatively, a 3D memory device can be formed by sequentially stacking multi-sessions, wherein each session contains a stack of word lines with less number of tiers. However larger lateral dimensions of staircase structures due to vertically stacked word lines still limits the storage density.

Various embodiments in the present disclosure provide a structure and method of a 3D memory device with memory strings and staircase structures formed on opposite sides of a substrate. Separating memory strings and staircase structures saves wafer area for the core memory arrays, leading to higher storage density. Forming memory strings and staircase structures on opposite sides of the substrate can also allow contact holes for the staircase structures having more relaxed ground rules (critical dimensions) and therefore reduce the etching and deposition aspect ratio. Furthermore, bending and folding the word lines in a three-dimensional configuration can potentially reduce the overall interconnect length and thereby reduce parasitic resistance and metal line loading. The disclosed 3D memory device can increase memory bandwidth and performance, and reduce energy and latency at operation.

Figure 4B:
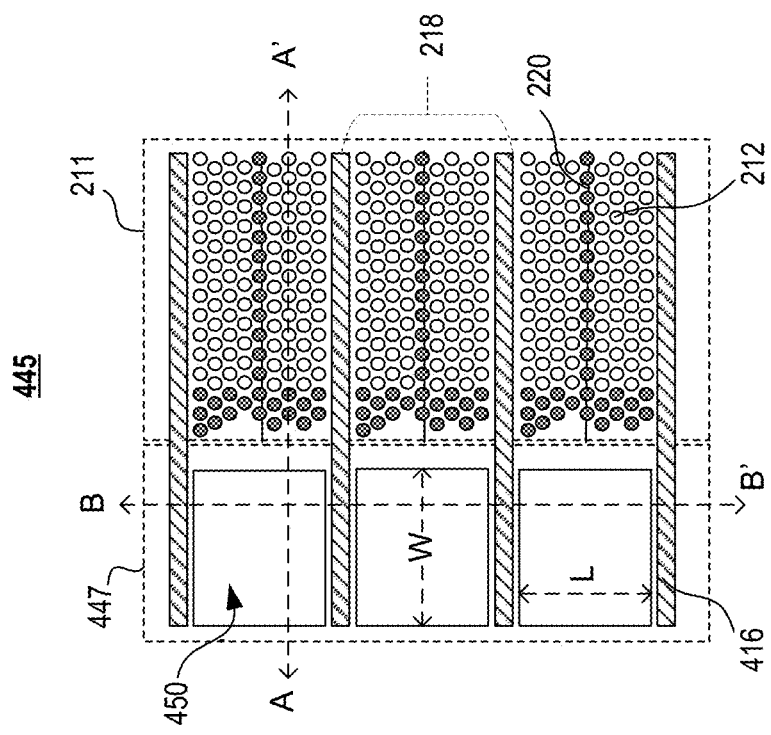
FIG. 4A-4B illustrate schematic top-down views of an exemplary 3D memory device with through-substrate-trenches, according to some embodiments of the present disclosure.
Figure 4A:
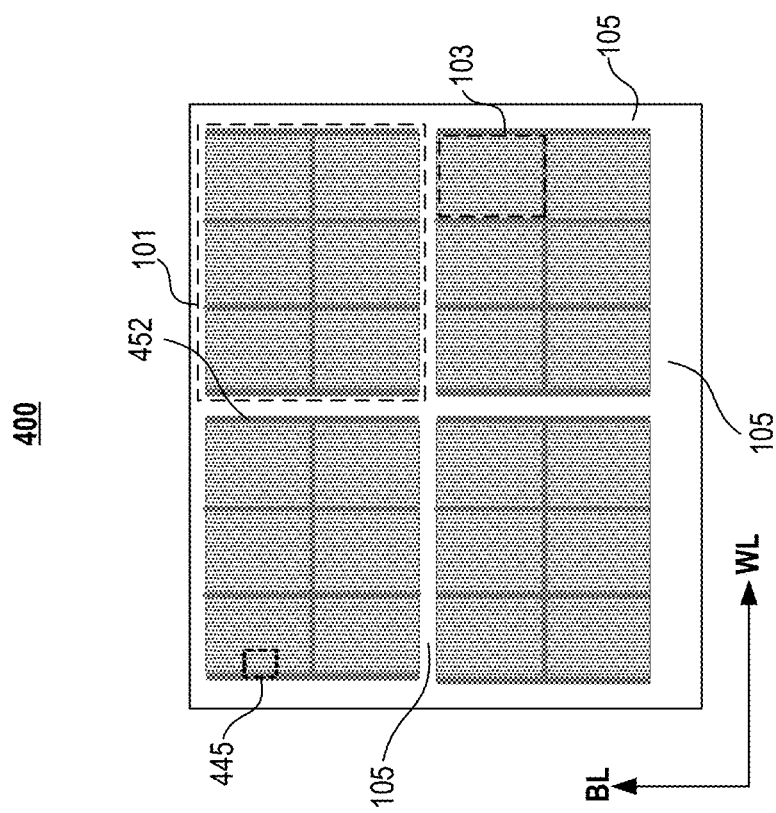

FIG. 4A illustrates a top-down view of an exemplary 3D memory device 400, according to some embodiments of the present disclosure. In this example, the 3D memory device 400 includes periphery regions 105 and four memory planes 101. Each memory plane 101 include six memory blocks 103. The configuration, size or number of the periphery, the memory planes and the memory blocks are for illustration purpose in FIG. 4A and should not limit the scope of present disclosure. The layout of the 3D memory device 400 is similar to the 3D memory device 100 in FIG. 1, except the changes described below.

FIG. 4B illustrates an enlarged top-down view of a first edge region 445 of the memory plane 101, according to some embodiments of the present disclosure. The first edge region 445 corresponds to region 108 in FIG. 1, including a channel structure region 211 and a through-substrate-trench (TST) region 447. The channel structure region 211 includes the memory strings 212 and slit structures 416, similar to the channel structure region 211 in FIG. 2A.

In some embodiments, the 3D memory device 400 includes a plurality of through-substrate-trenches (TSTs) 450. The TSTs 450 can be placed in the first edge region 445 and/or the second edge region 452 of the memory plane 101. Shown in FIG. 4B, the TST region 447 replaces the staircase region 210 in FIG. 2A. Instead of having staircase structures and an array of contact structures 214 formed on the staircase structures, the TST region 447 includes one or more TSTs 450 with a width W along the word line (WL) direction and a length L along the bit line (BL) direction. The dimensions of width W and length L of TST 450 are determined by the vertical height of the stacked word lines and will be discussed in details in the subsequent figures.

In some embodiments, a plurality of slit structures 416, extending in WL direction across channel structure region 211 and TST region 447, can divide a memory block into multiple memory fingers 218. At least some slit structures 416 can function as common source contacts for an array of memory strings 212 in channel structure regions 211. A top select gate cut 220 can be disposed in the middle of each memory finger 218 to divide the top select gate (TSG) of the memory finger 218 into two portions, and thereby two programmable (read/write) pages.

FIG. 5A illustrates a cross-sectional view of an exemplary structure 500A of a three-dimensional memory device, according to some embodiments, wherein the structure 500A includes the substrate 330, the insulating film 331, a hard mask 560 and a TST 450. The cross-sectional views of FIGS. 5A, 5B, 6-10 and 12-13 are along line AA' in FIG. 4B.

Substrate 330 can provide a platform for forming subsequent structures. The subsequent structures can be formed on a first (e.g., top or front) surface 330f or a "front side" of the substrate 330. The subsequent structures can also be formed on a second (e.g., bottom or back) surface 330b or a "back side" of substrate 330, wherein the first and second surfaces are on opposite sides of the substrate. And the subsequent structures are to be formed in a vertical direction (e.g., orthogonal to the front or second surface of substrate 330.) The first and second surfaces 330f/330b of substrate 330 can be both polished and treated to provide a smooth surface for high quality semiconductor devices. In some embodiments, the substrate 330 can be thinned down from a standard wafer thickness (about 700 μm for a silicon substrate) to a thickness mechanically strong enough to support the subsequent structures, for example, about 200 μm thick for a 200 mm silicon wafer.

In some embodiments, the substrate 330 includes any suitable material for forming the three-dimensional memory device. For example, the substrate 330 can include silicon, silicon germanium, silicon carbide, silicon on insulator (SOI), germanium on insulator (GOI), glass, gallium nitride, gallium arsenide, and/or other suitable III-V compound, any other suitable material, and/or combinations thereof. In some embodiments, substrate 330 can be also referred to as a semiconductor substrate.

In some embodiments, the substrate 330 can also include the first surface 330f with peripheral devices formed in the periphery region 105 and/or active device areas formed in the memory blocks 103 region. These structures are known to a person of ordinary skill in the art and are not shown in FIG. 5A for simplicity.

The peripheral devices can include any suitable semiconductor devices, for example, metal oxide semiconductor field effect transistors (MOSFETs), diodes, resistors, capacitors, etc. The peripheral devices can be used in the design of digital, analog and/or mixed signal circuits supporting the storage function of the memory core, for example, row and column decoders, drivers, page buffers, sense amplifiers, timing and controls.

The active device areas in the memory blocks can be surrounded by isolation structures, such as shallow trench isolation. Doped regions, such as p-type doped and/or n-type doped wells, can be formed in the active device area according to the functionality of the array devices in the memory blocks.

As shown in FIG. 5A, in some embodiments, the insulating film 331 can be disposed on top of the first surface 330f of the substrate 330. The insulating film 331 includes any suitable insulating materials, for example, silicon oxide, silicon oxynitride, silicon nitride, TEOS or silicon oxide with F-, C-, N-, and/or H-incorporation. The insulating film 331 can also include high-k dielectric materials, for example, hafnium oxide, zirconium oxide, aluminum oxide, tantalum oxide, or lanthanum oxide films.

The formation of the insulating film 331 on the substrate 330 can include any suitable deposition methods such as, chemical vapor deposition (CVD), physical vapor deposition (PVD), plasma-enhanced CVD (PECVD), rapid thermal chemical vapor deposition (RTCVD), low pressure chemical vapor deposition (LPCVD), sputtering, metal-organic chemical vapor deposition (MOCVD), atomic layer deposition (ALD), high-density-plasma CVD (HDP-CVD), thermal oxidation, nitridation, any other suitable deposition method, and/or combinations thereof.

Referring to FIG. 5A, the hard mask 560 is disposed on top of the insulating film 331 on the first surface of the substrate 330. The hard mask 560 is used to provide protection to the underlying devices and materials during subsequent etching process. In some embodiments, the hard mask 560 includes any suitable material that can withstand the etching process, for example, amorphous carbon. In some embodiments, amorphous carbon can be doped with other etch-resistant elements, such as boron, to improve the etch-resistance of the amorphous carbon. In some embodiments, a thin metal or metal oxide layer, such as zirconium oxide ($ZrO_2$), yttrium oxide ($Y_2O_3$), and aluminum oxide ($Al_2O_3$), can be disposed on top of the amorphous carbon layer. The amorphous carbon can be disposed by PECVD, sputtering, or any other suitable deposition method. The metal oxide layer can be disposed by ALD, sputtering, or any other suitable deposition method. The hard mask 560 is not limited to the exemplary materials described herein. Other options may include silicon oxide, silicon nitride, high-k dielectric materials and/or any combinations thereof.

The TST 450 extends through the hard mask 560, the insulating film 331 and the substrate 330. The TST 450 can be formed by lithography and etching. In addition to photoresist, an anti-reflective coating (ARC) such as dielectric ARC (DARC) or bottom ARC (BARC) can be used to improve lithography quality and provide extra protection during etching. After lithography, hard mask 560 can be etched first. The entire substrate can be etched through using, for example, high-aspect ratio plasma etching. In some embodiments, the silicon substrate can be etched through by alternating etching using $SF_6$ chemistry and protection film deposition using $C_4F_8$ chemistry.

It is noted that structure 500A in FIG. 5A only shows one TST 450. However structure 500A can include one or more TSTs 450, according to some embodiments. The TST 450 can also be placed in either the first or the second edge regions 445/452 of the memory planes 101, or both edge regions 445/452. For simplicity, one TST will be used as an example in the cross-sectional figures in the present disclosure.

The hard mask 560 can be rough and damaged during an aggressive plasma etching, and can be removed after the formation of the TST 450 prior to the subsequent processes. Etching process such as reactive-ion-etching (RIE) or wet chemical etching can be used to remove the hard mask 560 selectively to the underlying insulating film 331. Sidewalls 450s of the TST 450 can be cleaned and smoothed using, for example, sacrificial oxidation and oxide stripping, before the subsequent processes. In some embodiments, when the first surface 330f of the substrate 330 includes peripheral devices, the insulating film 331 can protect peripheral devices from RIE or wet chemical etching.

FIG. 5B illustrates a cross-sectional view of an exemplary structure 500B of a three-dimensional memory device, according to some embodiments, wherein the structure 500B includes a backside insulating film 331b on the second surface 330b of the substrate 330. Depending on the deposition process used, in some embodiments, the backside insulating film 331b can be disposed on the second surface 330b simultaneously when the insulating film 331 is disposed on the first surface 330f.

In some embodiments, the hard mask 560 can be disposed on the backside insulating film 331b. In this example, the TST 450 can be etched from the back side of the substrate 330, extending through the hard mask 560, the backside insulating film 331b, the substrate 330 and the insulating film 331 on the first surface 330f. In this example, the insulating film 331 can protect the peripheral devices on the first surface 330f from scratching or contamination during the patterning process to form TST 450. After TST 450 formation, the hard mask 560 can also be removed using similar process described above in FIG. 5A.

In some embodiments, peripheral devices can be formed in the periphery region 105 and/or active device areas formed in the memory blocks 103 region on the second surface (back side) of the substrate. In this example, the backside insulating film 331b can protect the peripheral devices during the subsequent processes for memory arrays. These structures are known to a person of ordinary skill in the art and are not shown in FIG. 5B for simplicity In the following descriptions, 3D memory structures formed over structure 500A will be used as examples for the subsequent processes. Similar structures can be formed over structure 500B, which would be apparent to a person of ordinary skill in the art.

Figure 6:
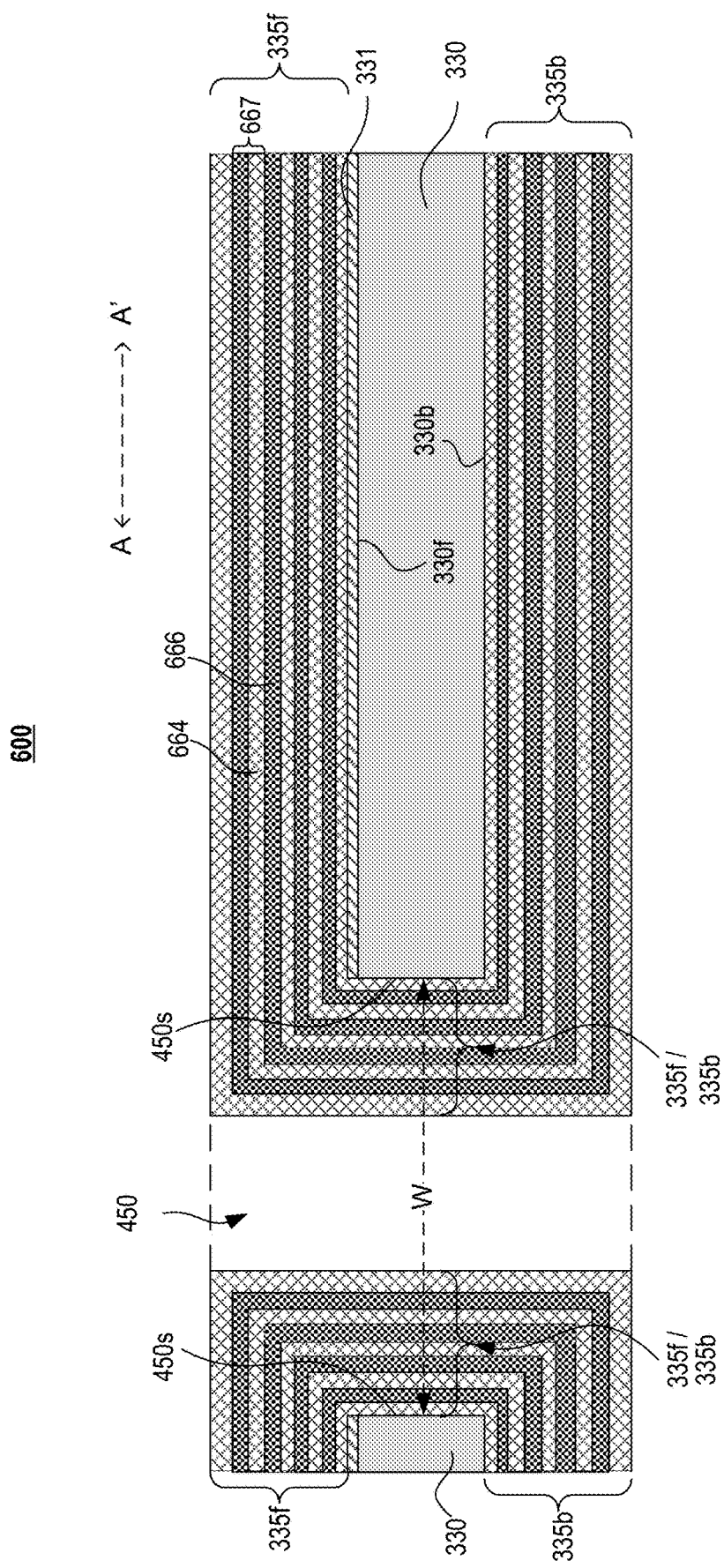
FIG. 6-10 illustrate schematic cross-sectional views of an exemplary 3D memory device at certain fabricating stages, according to some embodiments of the present disclosure.

FIG. 6 illustrates a cross-sectional view of an exemplary structure 600 of a three dimensional memory device, according to some embodiments, wherein the structure 600 includes a film stack 335f disposed on the insulating film 331 over the first surface 330f of the substrate 330 extending through the TST 450 to the second surface 330b of the substrate 330. The film stack over the first and second surfaces 330f/330b is also referred to as a first film stack 335f and a second film stack 335b, respectively. It is noted that the dimensions of the structures in the figures in this disclosure are for illustration purpose and should not be measured according to the ratio of the drawings.

In some embodiments, the first and second film stacks 335f/335b can be disposed over the structure 500A (in FIG. 5A) after removing the hard mask 560. In some embodiments, the first and second film stacks 335f/335b each includes a dielectric layer 664 alternatingly stacked with a conductive layer 666, wherein the dielectric layer 664 is configured to be the bottommost and the topmost layers of the first and second film stacks 335f/335b. In this configuration, each conductive layer 666 is sandwiched between two dielectric layers 664, and each dielectric layer 664 is sandwiched between two conductive layers 666 (except the bottommost and the topmost layer). The dielectric layer 664 and the conductive layer 666 can be similar to the alternating conductive and dielectric layers depicted in FIG. 3.

In some embodiments, the first film stack 335f on the insulating film 331 includes alternating conductive and dielectric layers 666/664 stacked in a direction perpendicular to the first surface 330f of the substrate 330. In some embodiments, the second film stack 335b on the second surface 330b of the substrate 330 includes alternating conductive and dielectric layers 666/664 stacked in a direction perpendicular to the second surface 330b of the substrate 330. In some embodiments, the first and second film stacks 335f/335b further include alternating conductive and dielectric layers 666/664 inside the through-substrate-trenches 450, stacked in a direction perpendicular to sidewalls 450s of the through-substrate-trenches 450.

Among the alternating conductive and dielectric layers 666/664, two adjacent layers of the dielectric layer 664 and the conductive layer 666 are also referred to as a conductive and dielectric layer pair 667. The formation of the first and second film stacks 335f/335b can involve disposing the dielectric layers 664 to each have the same thickness or to have different thicknesses. Example thicknesses of the dielectric layers 664 can range from 10 nm to 500 nm. Similarly, the conductive layers 666 can each have the same thickness or have different thicknesses. Example thicknesses of the conductive layers 666 can range from 10 nm to 500 nm.

Although only nine total layers are illustrated in the first and second film stacks 335f/335b in FIG. 6, it should be understood that this is for illustrative purposes only and that any number of layers may be included in the first and second film stacks 335f/335b.

In some embodiments, the first and second film stacks 335f/335b can include layers in addition to the dielectric layer 664 and the conductive layer 666, and can be made of different materials and with different thicknesses. The first and second film stack 335f/335b extends in a lateral direction that is parallel to the surface of the substrate 330.

In some embodiments, the dielectric layers 664 formed over the second surface 330b and inside the TST 450 can each have the same thickness as the dielectric layers 664 over the first surface 330f. In some embodiments, the dielectric layers 664 formed over the second surface 330b and inside the TST 450 can each have different thickness from the dielectric layers 664 over the first surface 330f. Similarly, the conductive layers 666 formed over the second surface 330b and inside the TST 450 can each have the same or different thickness from the conductive layers 666 formed over the first surface 330f. However, each dielectric layer 664 is a continuous film from the front side of the substrate, through the TST 450, to the back side of the substrate such that two adjacent conductive layers 666 do not form electrical short with each other. Similarly, each conductive layer 666 is a continuous film from the front side of the substrate, through the TST 450, to the back side of the substrate, such as each conductive layer 666 do not form electrical open.

In some embodiments, the width W and the length L of the TST 450 (also shown in FIG. 4B) can be designed such that the width W and length L are no less than twice the thickness of the first or the second film stack 335f/335b.

In some embodiments, the dielectric layer 664 can include any suitable insulating materials, for example, silicon oxide, silicon oxynitride, silicon nitride, silicon oxide with F-, C-, N-, and/or H-incorporation, or any combination thereof.

In some embodiments, the conductive layer 666 includes any suitable conductive material, for example, poly-crystalline silicon, poly-crystalline germanium, poly-crystalline germanium-silicon, or any combination thereof. In some embodiments, the conductive layer 666 also includes amorphous semiconductor materials, such as amorphous silicon, amorphous germanium or any combination thereof. In some embodiments, the poly-crystalline or amorphous material of the conductive layer 666 can be incorporated with any suitable type of dopant, such as boron, phosphorous, or arsenic, to increase the conductivity of the material. In some embodiments, the dielectric layer 664 can be silicon oxide and the conductive layer 666 can be poly-crystalline silicon.

The formation of the dielectric layer 664 and the conductive layer 666 can include any suitable deposition methods such as, CVD, RTCVD, PECVD, LPCVD, MOCVD, HDP-CVD, PVD, ALD or any combination thereof. In some embodiments, poly-crystalline semiconductor material can be deposited in an amorphous state and converted to poly-crystalline through subsequent thermal treatments. In some embodiments, the dopants in the conductive layer 666 can be incorporated through in-situ doping as the poly-crystalline or amorphous semiconductor material being deposited, by simultaneously flowing chemical gas, for example, diborane ($B_2H_6$) or phosphine ($PH_3$). Other doping techniques for 3D structure, such as plasma doping, can also be used to increase conductivity of the conductive layer 666. In some embodiments, after dopant incorporation, a high temperature annealing process can be performed to active the dopants in the conductive layer 666.

Figure 7:
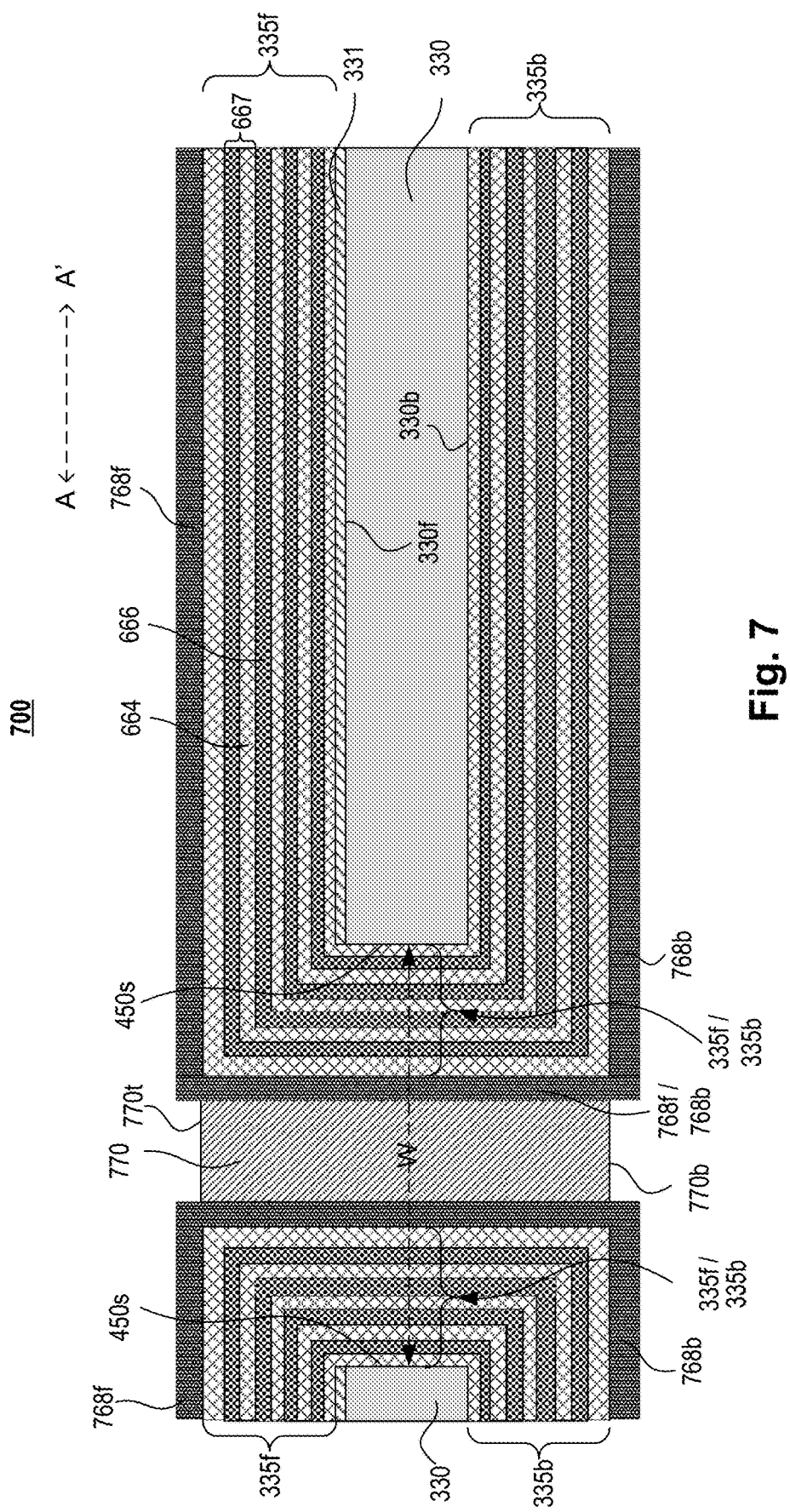

FIG. 7 illustrates a cross-sectional view of an exemplary structure 700 of a three dimensional memory device, according to some embodiments, wherein the structure 700 includes first and second polish-stopping layers 768f/768b and a trench filling structure 770.

In some embodiments, the second polish-stopping layer 768b can be disposed over the structure 600 in FIG. 6 to cover the exposed surface of the second film stack 335b on the back side of the substrate. In some embodiments, the first polish-stopping layer 768f can also be disposed to cover the exposed surface of the first film stack 335f on the front side of the substrate 330. Depending on a technique used, the exposed surfaces of the first and second film stacks 335f/335b inside the TST 450 can also be covered by the first/second polish-stopping layer 768f/768b. FIG. 7-13 illustrate exemplary structures with the first and second polish-stopping layers 768f/768b disposed on the first and second film stacks 335f/335b, respectively, as well as inside the TST 450.

The first/second polish-stopping layers 768f/768b can include any material that is resistant to aggressive polishing process, for example, silicon nitride, silicon oxide, silicon oxynitride, poly-crystalline silicon, poly-crystalline germanium, poly-crystalline germanium-silicon, or any combination thereof. The first/second polish-stopping layers 768f/768b can also include amorphous silicon, amorphous germanium or any combination thereof. The formation of the first and second polish-stopping layers 768f/768b can include any suitable deposition methods such as, CVD, PECVD, LPCVD, MOCVD, RTCVD, HDP-CVD, PVD, ALD or any combination thereof.

In some embodiments, the structure 700 also includes a trench filling structure 770, wherein the trench filling structure 770, together with the first and second polish-stopping layers 768f/768b and the first and second film stacks 335f/335b, can fill the openings of TST 450, such that debris cannot be trapped inside TST 450 during the subsequent processes. The trench filling structure 770 can include any suitable insulators, such as silicon oxide, silicon nitride, silicon oxynitride, TEOS, etc., and can be disposed using CVD, LPCVD, RTCVD, PECVD, MOCVD, HDP-CD, PVD, ALD, or any combination thereof.

In some embodiments, a first and a second surfaces 770t/770b of the trench filling structure 770 can be coplanar with the top surfaces of the first and second film stacks 335f/335b, respectively, using a technique such as chemical mechanical polish (CMP), or ME etch-back, and/or any combination thereof.

Figure 8:
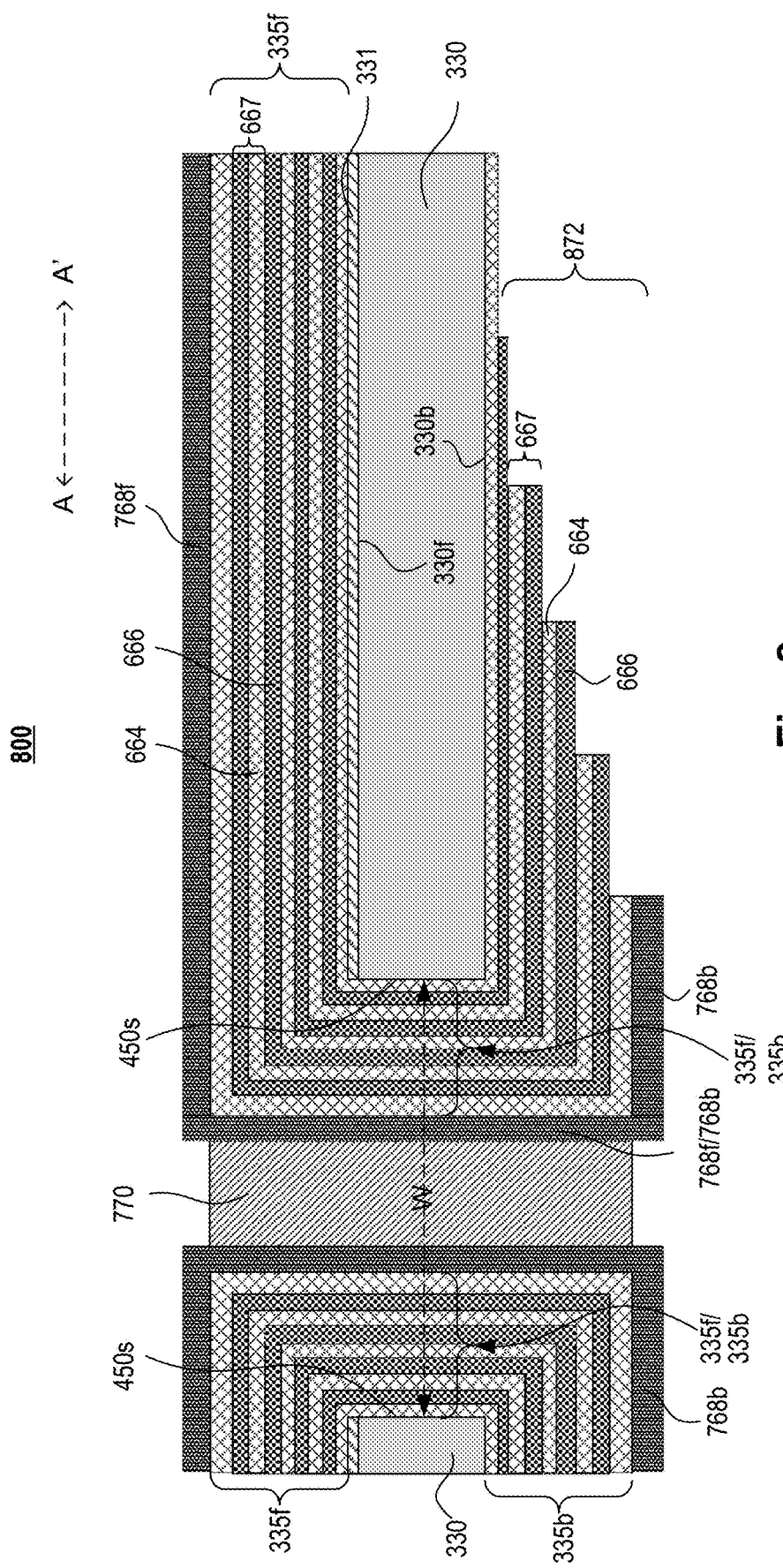

FIG. 8 illustrates a cross-sectional view of an exemplary structure 800 of a three dimensional memory device, according to some embodiments, wherein the structure 800 includes a staircase structure 872 formed on an edge of the second film stack 335b on the second surface 330b of the substrate 330. The staircase structure 872 enables electrical contacts to the conductive layer 666 of each conductive and dielectric layer pair 667. In the staircase structure 872, a staircase step includes a conductive and dielectric layer pair 667, and thus also called a staircase (SC) layer or SC step 667.

The staircase structure 872 includes the conductive layers 666, each terminating at a different length in a horizontal direction over the second surface 330b of the substrate 330 to allow electrical connections to each of the conductive layers 666.

In some embodiments, processes on the back side of the substrate can be performed by flipping the substrate with the back side facing up in the process tools. Lithography alignment to the features on the front side of the substrate can be done with a light source transparent to the substrate. For example, on a silicon substrate, infrared laser can be used for back to front alignment.

In some embodiments, the plural steps of the staircase structure 872 can be formed by applying a repetitive etch-trim process on the second film stack 335b using a mask stack (not shown). In some embodiments, the mask stack can include a photoresist or carbon-based polymer material. In some embodiments, the mask stack is removed after forming the staircase structure 872.

The etch-trim process includes an etching process and a trimming process. During the etching process, a portion of SC layer 667 with exposed surface is removed. The etch depth is a thickness of the SC layer 667. The etching process for the dielectric layer 664 can have a high selectivity over the conductive layer 666, and/or vice versa. Accordingly, an underlying SC layer 667 can function as an etch-stop layer. As a result, one staircase step is formed during each etch-trim cycle.

In some embodiments, the SC layer 667 can be etched using an anisotropic etching such as a reactive ion etch (RIE) or other dry etch processes. In some embodiments, the dielectric layer 664 is silicon oxide. In this example, the etching of silicon oxide can include RIE using fluorine based gases such as carbon-fluorine ($CF_4$) based gases, hexafluoroethane ($C_2F_6$) based gases, and/or any other suitable gases.

In some embodiments, the silicon oxide layer can be removed by wet chemistry, such as hydrofluoric acid or a mixture of hydrofluoric acid and ethylene glycol. In some embodiments, a timed etching approach can be used. In some embodiments, the conductive layer 666 is poly-crystalline silicon. In this example, the etching of poly-crystalline silicon can include RIE using $SF_6$ or $Cl_2/BCl_3$ based gases. The methods and etchants to remove a single layer stack should not be limited by the embodiments of the present disclosure.

The trimming process includes applying a suitable etching process (e.g., an isotropic dry etch or a wet etch) on the mask stack such that the mask stack can be pulled back laterally. The lateral pull-back dimension determines the lateral dimension of each step of the staircase structure 872. After mask stack trimming, one portion of the topmost SC layer 667 is exposed and the other portion of the topmost SC layer 667 remains covered by the mask stack. The next cycle of etch-trim process resumes with the etching process.

In some embodiments, the mask stack trimming process can include dry etching, for example, RIE using $O_2$, Ar, $N_2$, etc.

In some embodiments, the topmost SC layer 667 can be covered by the dielectric layer 664. In some embodiments, the topmost SC layer 667 can further be covered by the second polish-stopping layer 768b. A process step of removing the dielectric layer 664 and/or the second polish-stopping layer 768b can be added to the etching process of each etch-trim cycle to form the staircase structure 872.

Figure 9:
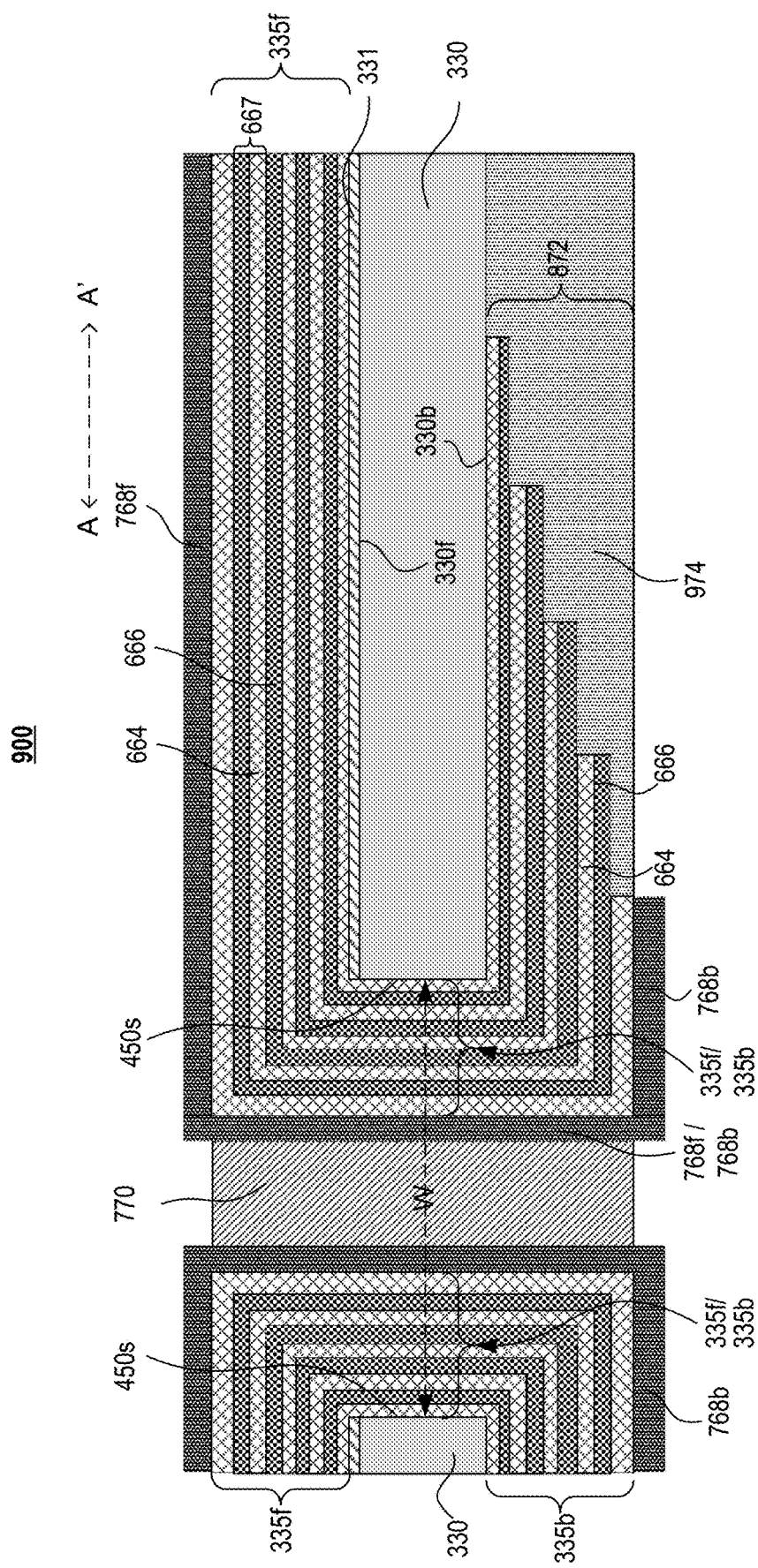

FIG. 9 illustrates a cross-sectional view of an exemplary structure 900 of a three dimensional memory device, according to some embodiments, wherein the structure 900 includes an insulating layer 974 with a surface coplanar with the top surface of the second film stack 335b on the back side of the substrate 330.

In some embodiments, the insulating layer 974 can be disposed on the back side of the substrate 330 after forming the staircase structure 872. The insulating layer 974 can be made of any suitable insulator, for example, silicon oxide, silicon oxynitride, silicon nitride, or any combination thereof. In some embodiments, the insulating layer 974 can include spin-on-glass or any low-k dielectric material such as carbon-doped oxide (CDO or SiOC or SiOC:H), or fluorine doped oxide (SiOF), etc. In some embodiments, the insulating layer 974 can be disposed using processes, for example, CVD, PVD, spin-coating, sputtering, etc.

In some embodiments, the forming of the insulating layer 974 further includes a planarization process, for example RIE etch-back or CMP, using the second polish-stopping layer 768b as s polish-stop. In some embodiments, the first polish-stopping layer 768f on the front side of the substrate 330 can function as a protective layer to prevent the structures on the front side from being damaged during ME or CMP. After forming the coplanar insulating layer 974, the first/second polish-stopping layers 768f/768b can be removed from the front and back side of the substrate 330.

Figure 10:
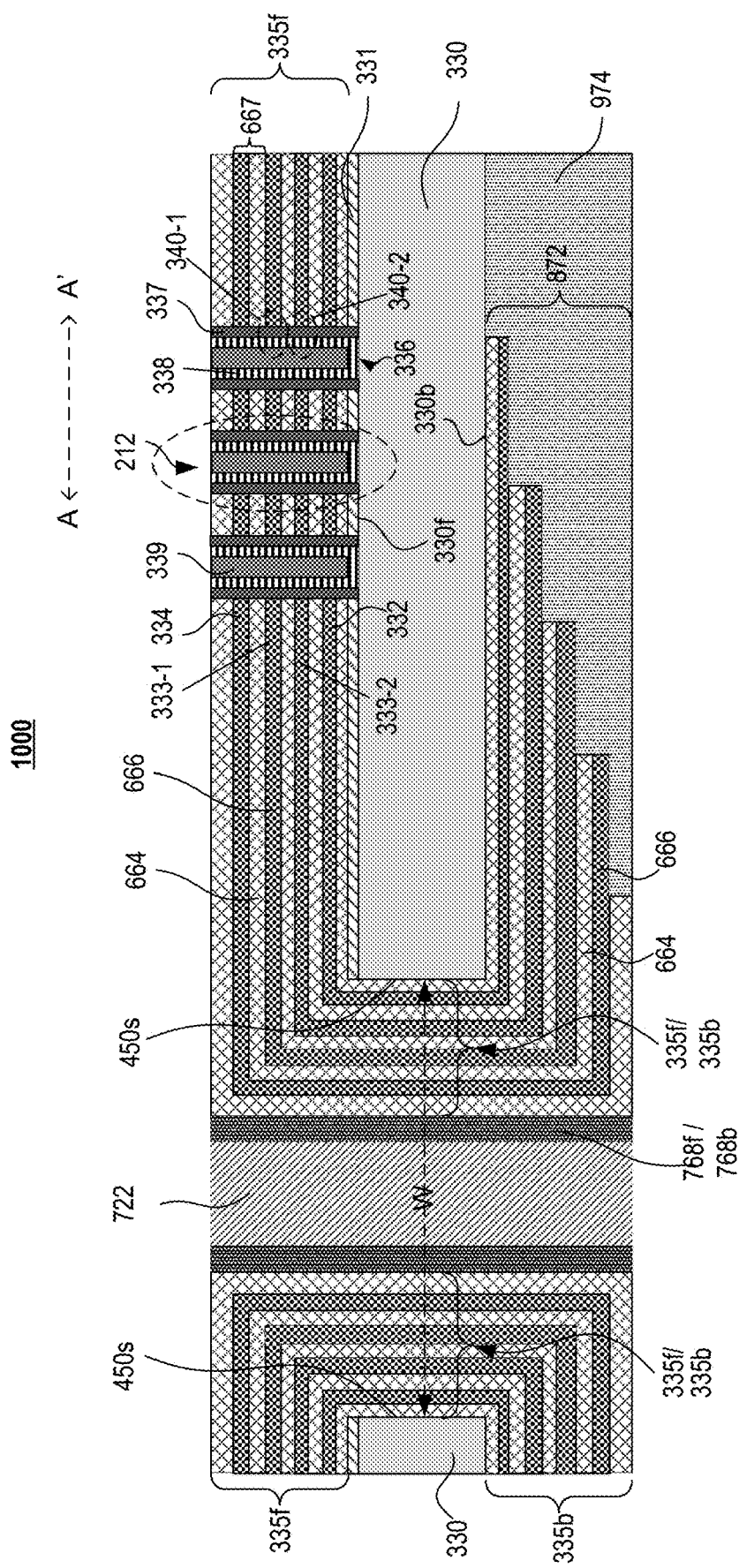

FIG. 10 illustrates a cross-sectional view of an exemplary structure 1000 of a three dimensional memory device, according to some embodiments, wherein the structure 1000 includes a plurality of memory strings 212 through the first film stack 335f and the insulating film 331 on the front side of the substrate 330.

For illustrative purpose, three memory strings are shown in FIG. 10. In this example, each memory string 212 includes two memory cells 340-1 and 340-2, intersecting with two control gates 333-1 and 333-2, corresponding to two conductive layers 666 of the first and film stacks 335f/335b. Each memory strings 212 includes a channel hole 336 extending through the insulating film 331 and the first film stack 335f of alternating conductive and dielectric layers on the first surface 330f of the substrate 330. The memory strings 212 also includes a memory film 337 on a sidewall of the channel hole 336, a channel layer 338 covering a sidewall of the memory film 337, and a core filling film 339 covering a sidewall of the channel layer 338 and filling the channel hole 336. It is noted that the number of memory strings and memory cells are shown for illustration purposes in FIG. 10, and can be more to increase storage capacity. The structure 1000 can include other structures, for example, through array contact, TSG cut, and dummy channel structure, which are not shown in FIG. 10 for simplicity.

Figure 11A:
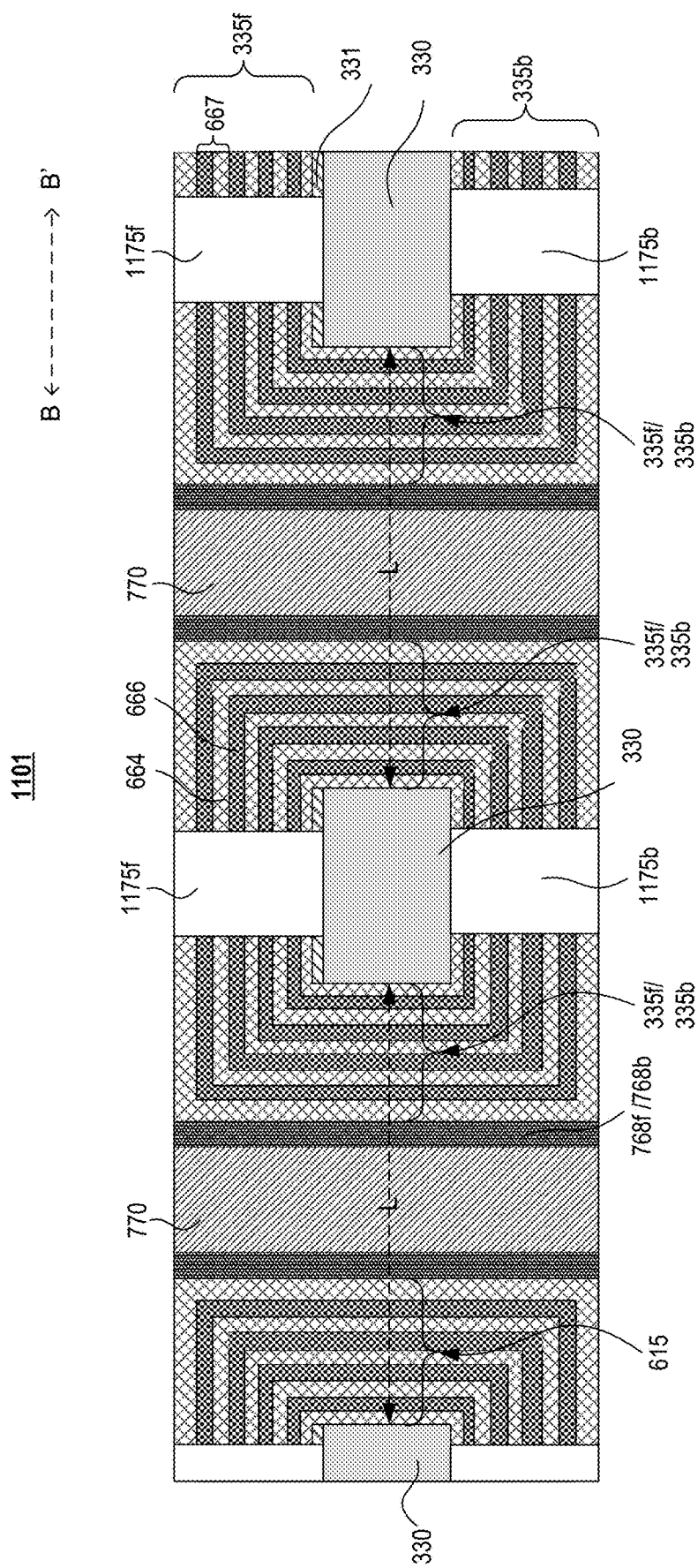
FIG. 11A-11B illustrate schematic cross-sectional views of an exemplary 3D memory device at certain fabricating stages, according to some embodiments of the present disclosure.

FIG. 11A illustrates a cross-sectional view of an exemplary structure 1101 of a three dimensional memory device, according to some embodiments, wherein the structure 1101 is along line BB' in the first edge region 445 in FIG. 4B. The structure 1101 includes a plurality of first and second slit openings 1175f and 1175b formed in the first and second film stacks 335f/335b, respectively. The first and second slit openings 1175f and 1175b extend through at least all the conductive layers 666 of the first and second film stacks 335f/335b.

The first and second slit openings 1175f/1175b can be formed by etching through the alternating conductive and dielectric layers. In some embodiments, the alternating conductive and dielectric layers are made of polysilicon and silicon oxide. In this example, polysilicon can be etched using RIE with chemical gases such as $SF_6$ or $Cl_2/BCl_3$, and/or other suitable etchants for polysilicon. Silicon oxide can be etched using RIE with chemical gases such as $CF_4$, $CHF_3$, $C_2F_6$, or $C_3F_6$ and/or other suitable etchants for silicon oxide. Lithography alignment from back side to the front side of the substrate can be implemented using a light source transparent to the substrate 330, for example, infrared laser for a silicon substrate.

Figure 11B:
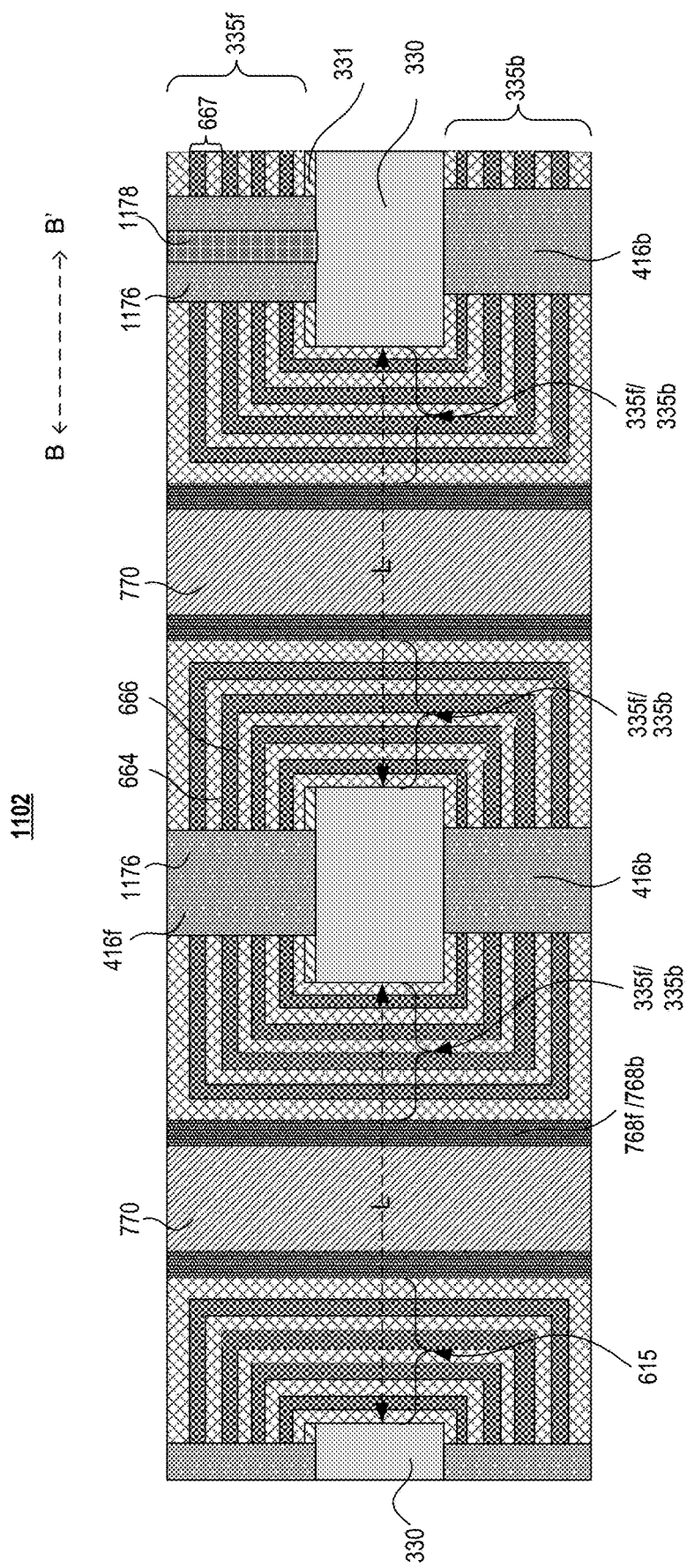

FIG. 11B illustrates a cross-sectional view of an exemplary structure 1102 of a three dimensional memory device, according to some embodiments, wherein the structure 1102 includes a plurality of first and second slit structures 416f and 416b formed in the first and second film stacks 335f/335b, respectively.

After forming the first and second slit openings 1175f/1175b, a slit filling material 1176 can be disposed in the plurality of the first and second slit openings 1175f/1175b on the respective first and second surfaces 330f/330b of the substrate. Extra slit filling materials outside the slit openings 1175f/1175b can then be removed and coplanar surfaces can be formed between the first/second slit structures 416f/416b and the first/second film stacks 335f/335b, respectively, using a technique, such as RIE etch-back or CMP.

In some embodiments, the first and second slit structures 416f/416b can be completed sequentially. For example, the first slit structures 416f can be formed in the first film stack 335f first, including forming the first slit openings, disposing slit filling material 1176 in the first slit openings and the forming coplanar first slit structures 416f. Then the second slit structures 416b can be formed in the second film stack 335b, using similar process steps. In some embodiments, the second slit structures 416b can be formed first and then the first slit structures 416f.

The first and second slit structures 416f/416b can include any suitable insulators, such as silicon oxide, silicon nitride, silicon oxynitride, TEOS, etc., and can be disposed using CVD, LPCVD, RTCVD, PECVD, MOCVD, HDP-CD, PVD, ALD, or any combination thereof.

In a vertical direction, the first and second slit structures 416f/416b extend through at least all the conductive layers 666 in the first film stack 335f. In some embodiments, some of the first slit structures 416f can extend through the first film stack 335f and the insulating film 331. In this example, some of the first slit structures 416f can include a conductive core 1178, wherein the conductive core 1178 can be surrounded by the slit filling material 1176, configured to function as a common source contact to the doped source line region 344 (shown in FIG. 3) for the memory strings.

Shown in FIG. 4B and labeled as slit structures 416 from the top-down view, the first and second slit structures 416f/416b extend laterally across the channel structure region 211 and the TST region 447. In some embodiments, the first/second slit structures 416f/416b extend vertically through the first and second film stacks 335f/335b, respectively, and can thereby divide a memory block 103 into individually programmable and readable memory fingers 218 (see FIG. 4B).

Figure 12:
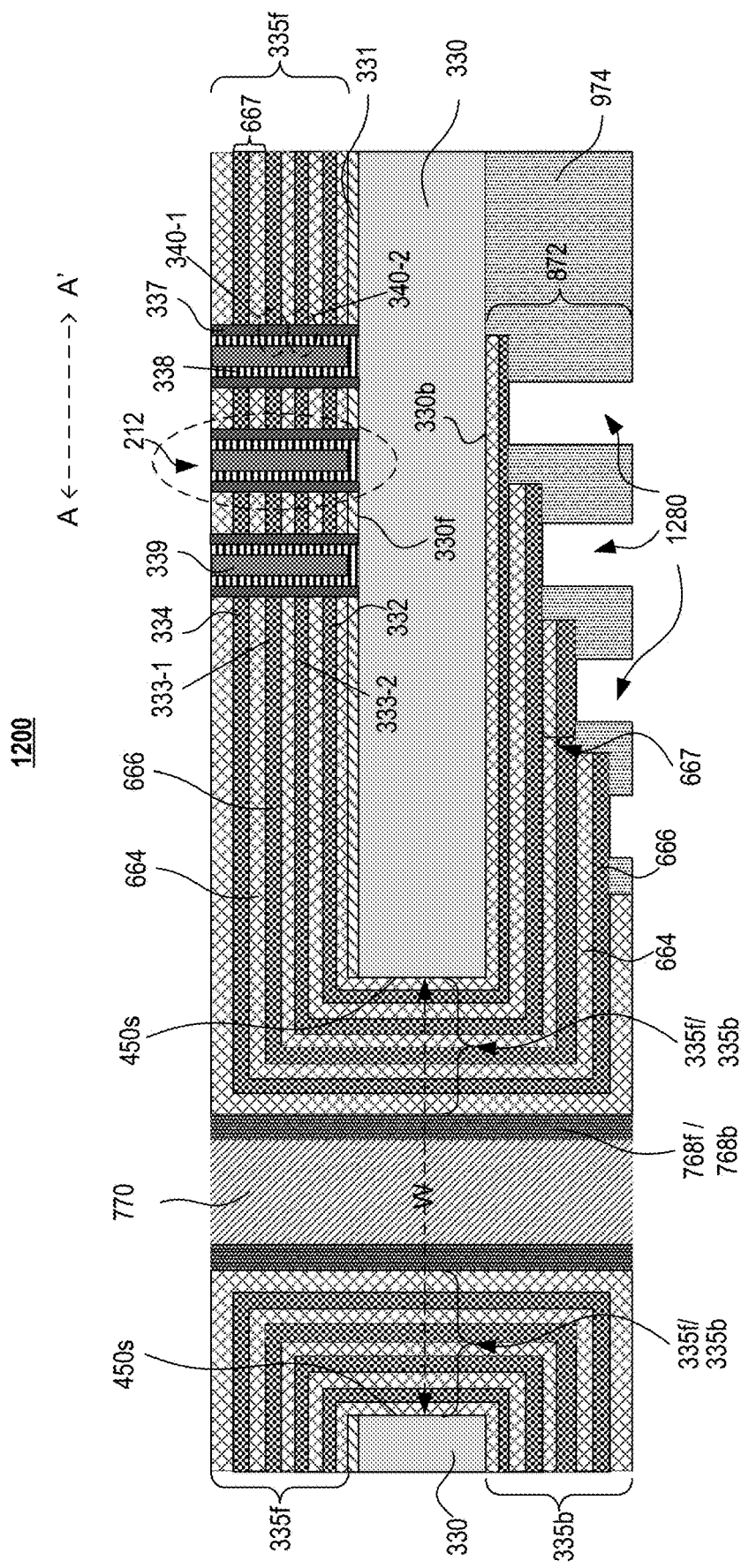
FIG. 12-13 illustrate schematic cross-sectional views of an exemplary 3D memory device at certain fabricating stages, according to some embodiments of the present disclosure.

FIG. 12 illustrates a cross-sectional view of an exemplary structure 1200 of a three dimensional memory device, according to some embodiments, wherein the structure 1200 includes a plurality of contact holes 1280 in the insulating layer 974 on the back side of the substrate 330.

In some embodiments, photoresist or polymer material can be used as a mask layer to etch the contact holes 1280. One or more masks and patterning processes can be used to form the contact holes 1280. In some embodiments, the insulating layer 974 can include an etch-stop layers (not shown). A selective etching process can be used such that the etching rate of the insulating layer 974 is higher than the etching rate of the etch-stop layer or the conductive layer 666 of the staircase structure 872. In some embodiments, during the one or more etching processes that form the contact holes 1280, the etch-stop layer can protect the underlying structure until all the contact holes 1280 are formed for each level of the staircase structure 872. For example, the contact hole 1280 for the staircase (SC) layer 667 closer to the second surface 330b of the substrate 330 requires longer etch time than the contact hole 1280 for the SC layer 667 away from the second surface 330b of the substrate 330. The contact holes 1280 extend through the insulating layer 974, exposing the conductive layer of the SC layer 667. In some embodiments, the contact holes 1280 also extend through the etch-stop layer to expose the conductive layer of the SC layer 667. In some embodiments, the selective etching includes anisotropic dry etching using chemical etchant, for example, $CF_4$, $CHF_3$, $C_2F_6$, or $C_3F_6$, and/or other suitable etchants for etching silicon oxide or silicon nitride.

Figure 13:
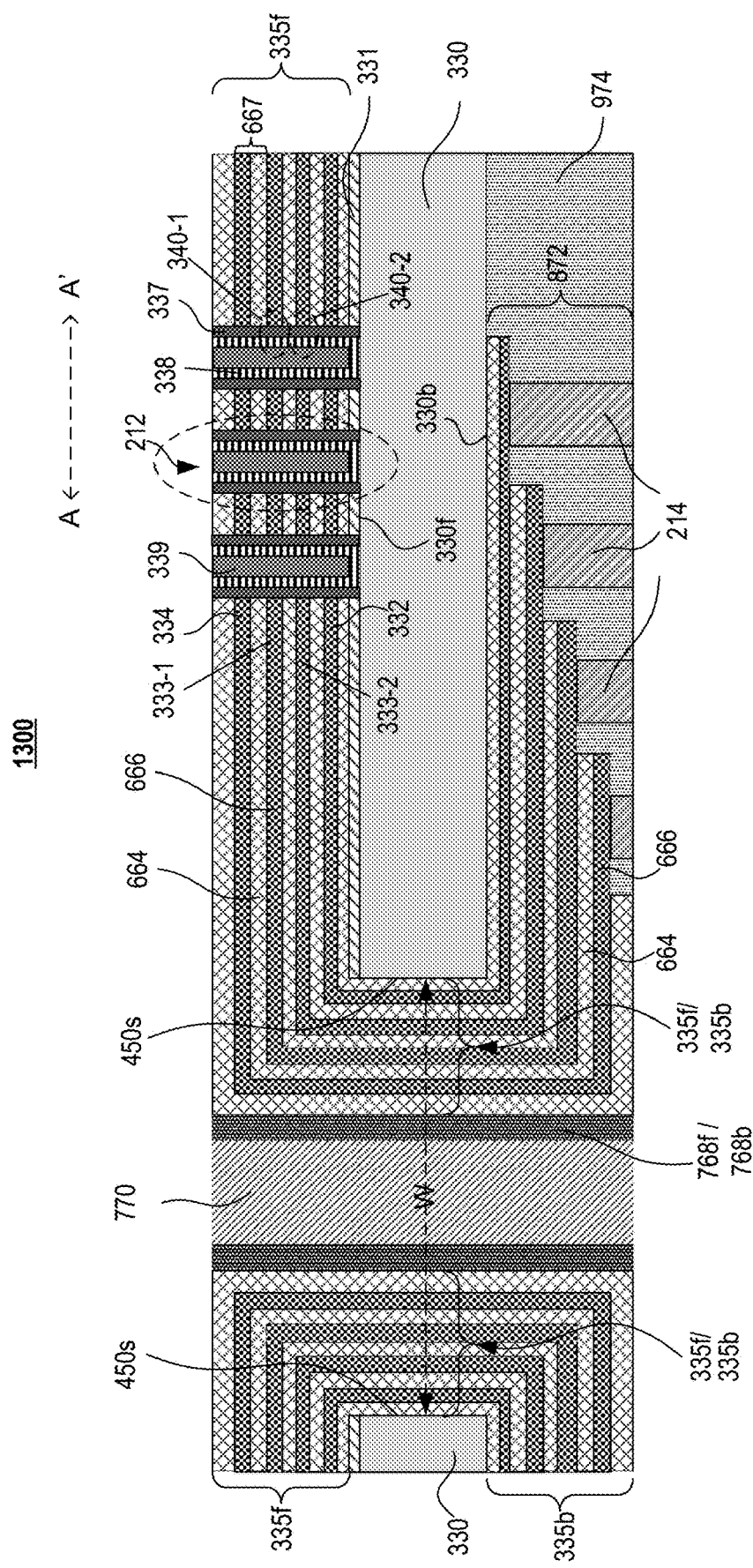

FIG. 13 illustrates a cross-sectional view of an exemplary structure 1300 of a three dimensional memory device, according to some embodiments, wherein the structure 1300 includes a plurality of contact structures 214. The contact structures 214 are connected to the conductive layers 666 of the staircase structure 872 on the back side of the substrate 330.

The contact structures 214 can be formed by disposing a conductive material in the contact holes 1280 (FIG. 12) and directly on the exposed portions of the conductive layer 666 of the staircase structure 872. Accordingly, each of the conductive layers 666 of the second film stack 335b can be electrically connected from the back side of the substrate.

In some embodiments, the contact structures 214 can include a metal or metallic compound, such as tungsten, cobalt, nickel, copper, aluminum, titanium, tantalum, tantalum nitride (TaN), and/or any combination thereof. The metal or metallic compound can be formed by any suitable deposition methods, for example, sputtering, thermal evaporation, e-beam evaporation, ALD, PVD, and/or any combination thereof.

In some embodiments, the contact structure 214 can also include a metal silicide, including $WSi_x$, $CoSi_x$, $NiSi_x$, or $AlSi_x$, etc. In this example, the conductive layer 666 of the second film stack 335b can be polycrystalline silicon. The forming of the metal silicide material can include disposing a metal layer directly on the polycrystalline silicon exposed inside the contact holes 1280 and then applying a thermal annealing process followed by removal of unreacted metal.

In some embodiments, the contact structures 214 can be coplanar with the insulating layer 974 using a planarization process, for example, a CMP process.

Through the contact structures 214, the electrical conductive path for the gate electrode of each memory cell can be wired up to the surface at the back side of the substrate, enabling various configurations of word lines and top/lower select gates for the 3D memory in the back-end-of-line process.

Moving the staircase structure 872 from the front side of the substrate 330 to the back side can save area for more memory arrays (or strings) on the front side, and therefore increase memory density. Furthermore, on the back side of the substrate 330, each staircase level can have wider steps and allow wider contact holes 1280 for the contact structures 214. With aggressively increased word line stack (e.g., the first and second film stacks 335f/335b), the aspect ratio for etching the contact holes and disposing the metallic materials for the contact structures 214 can be greatly reduced.

After forming structure 1300, fabrication of 3D memory device can be resumed with back-end-of-line (BEOL) metal interconnect lines, and are known to a person with ordinary skill in the art. In some embodiments, a second session of word line stack can be added to the structure 1300 to further increase the vertical number of memory cells.

FIG. 14A-14C illustrate the schematics of the connections between BEOL metal interconnect lines 343 and the gate electrodes (e.g., the conductive layers 666 of staircase structure 872 or the first/second film stack 335f/335b), according to some embodiments.

In FIG. 14A, the TST 450 is formed on one side of the memory strings, at one edge of the memory plane, for example, in the first edge region 445 in FIG. 4A. Accordingly, the staircase structure 872 is also formed on one side of the memory strings, at the edge of the second film stack 335b on the back side of the substrate 330. In this example, each conductive layer 666 of the staircase structure 872 is connected to the metal interconnect line 343 through the contact structures 214.

In FIG. 14B, the TST 450 is formed on each of the two sides of the memory strings, at each of the two edges of the memory plane, for example, in the first/second edge regions 445/452 in FIG. 4A. Accordingly, the staircase structure 872 is formed on each of the two sides of the memory strings, at the edge of each of the two second film stacks 335b. In this example, odd conductive layers of one staircase structure 872 and even conductive layers of the other staircase structure are connected to metal interconnect lines 343 through the contact structures 214. In this example, the metal interconnect lines 343 only need to connect to every other contact structures 214. In some embodiments, the contact structure 214 can be formed on every other conductive layers of the second film stack 335b. Therefore, process window can be larger and yield can be improved. In addition, because of larger pitch, the metal interconnect lines 343 and/or the contact structures 214 can be designed wider and have less metal line loading.

In FIG. 14C, the TST 450 is formed on each of the two sides of the memory strings, at each of the two edges of the memory plane, for example, in the first/second edge regions 445/452 in FIG. 4A. Accordingly, the staircase structure 872 is formed on each of the two sides of the memory strings, at the edge of each of the two second film stacks 335b. In this example, each contact structure on each of the staircase structures connects to the metal interconnect line 343. In this example, each control gate of a memory cell is driven by two word lines and two metal interconnect lines 343, wherein the two word lines and the two metal interconnect lines 343 are electrically connected. Doubling the metal connections can reduce parasitic resistance and metal line loading, and thereby increase drive current to the control gates of the memory cells. Therefore the programming or reading speed of the memory cells can be improved.

Figure 15:
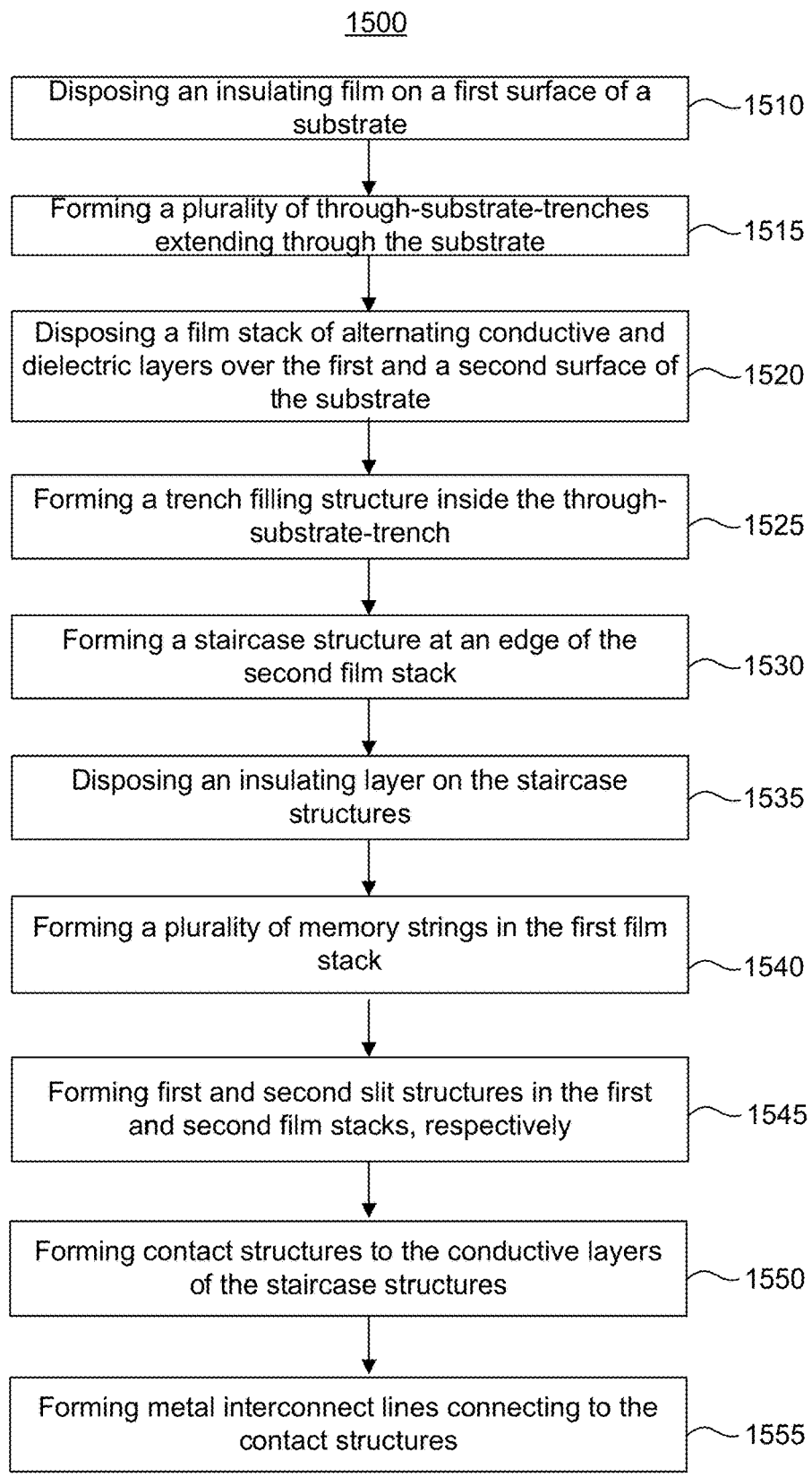
FIG. 15 illustrates a flow diagram of an exemplary method for forming a 3D memory device, according to some embodiments of the present disclosure.

FIG. 15 illustrates an exemplary method 1500 for forming staircase and contact structures for a three-dimensional memory array, according to some embodiments. The process steps of the method 1500 can be used to form memory device structures illustrated in FIGS. 5A-14C. The process steps shown in method 1500 are not exhaustive and other process steps can be performed as well before, after, or between any of the illustrated process steps. In some embodiments, some process steps of exemplary method 1500 can be omitted or include other process steps that are not described here for simplicity. In some embodiments, process steps of method 1500 can be performed in a different order and/or vary.

At process step 1510, an insulating film can be disposed on a first surface (e.g., front surface or front side) of a substrate. In some embodiments, peripheral devices and active areas in the memory array can be formed on the first surface of the substrate prior to forming the insulating film. The insulating film can be the insulating film 331 in FIG. 5A.

At process step 1515, a plurality of through-substrate-trenches (TSTs) are formed at an edge of a memory plane. The TSTs penetrate the insulating film and the silicon substrate, from the first surface (e.g. front surface) to a second surface (e.g. back surface or back side), wherein the first and second surfaces are on opposite sides of the substrate. A hard mask can be used for etching the deep TSTs. The structure can be the structure 500A or 500B shown in FIGS. 5A and 5B respectively. Forming the TST can be similar to the processes used for TST 450.

At process step 1520, a film stack is disposed on the first and second surfaces of the substrate, respectively. The film stack on the first and second surfaces, also referred to as the first and second film stacks can be the first and second film stacks 335f/335b in FIG. 6, with alternating conductive and dielectric layers. The first and second film stacks are also disposed inside the TSTs and each conductive and dielectric layer is continuous from the front side, through TST, to the back side.

At process step 1525, first and second polish-stopping layers are disposed on the first and second film stacks of alternating conductive and dielectric layers. The first and second polish-stopping layers are similar to the first and second polish-stopping layers 768f/768b in FIG. 7. Then a trench filling material can be disposed inside the through-substrate-trenches, wherein the trench filling material can include an insulator such as silicon oxide, silicon oxynitride or silicon nitride. Finally, coplanar surfaces can be formed between the trench filling material and the first and second film stacks on the first and second surfaces of the substrate using a planarization process such as chemical mechanical polishing (CMP) or reactive-ion-etching (RIE) etch-back. A trench filling structure is then formed inside the TST, wherein the trench filling structure is similar to the trench filling structure 770 in FIG. 7.

At process step 1530, a staircase structure is formed at an edge of the second film stack on the second surface of the substrate. The forming of the staircase structures includes removing a portion of each conductive and dielectric layer pair at a different length in a horizontal direction over the second surface of the substrate to allow electrical connections to each of the conductive layers. The staircase structure is similar to the staircase structure 872 in FIG. 8, and can be formed similarly, by using a repetitive etch-trimming process.

At process step 1535, an insulating layer is disposed over the staircase structure on the back side of the substrate, followed by a planarization process to form coplanar surfaces between the insulating layer and the topmost dielectric layer of the staircase structure. An example of the structure is shown in FIG. 9.

At process step 1540, a plurality of memory strings are formed in the first film stack on the first surface (front side) of the substrate. The memory strings are similar to the memory string 212 in FIG. 10, extending through the insulating film and the first film stack with alternating conductive and dielectric layers. The memory string includes a memory film, a channel layer and a core filling film.

At process step 1545, a first and a second slit structures are formed in the first and second film stacks on the front side and the back side of the substrate, respectively, to divide a memory block into a plurality of programmable and readable memory fingers. Examples of the first and second slit structures are shown in FIG. 11A-11B. The forming of the first and second slit structures includes etching the first and second film stacks of alternating conductive and dielectric layers on the first and second surfaces of the substrate to form a plurality of first and second slit openings (see FIG. 11A), disposing a slit filling material in the plurality of first and second slit openings, and forming coplanar surfaces between the first and second slit filling and the first and second film stacks, respectively (see FIG. 11B). In some embodiments, the slit filling material includes an insulator such as silicon oxide, silicon oxynitride or silicon nitride. In some embodiments, the slit structure can further include a conductive core surrounded by an insulator, configured to function as a common source contact for the memory strings.

At process step 1550, a plurality of contact structures are formed on the conductive layers of the staircase structures. The forming of the contact structures includes the following process steps. First, a plurality of contact holes can be formed in the insulating layer over the staircase structure on the back side of the substrate, exposing the conductive layers of the staircase structure (as shown in FIG. 12). Then, a metallic material can be disposed inside the contact holes to directly contact the conductive layers. Finally a planarization process can be used to form coplanar surface on the back side of the substrate. The contact structures can provide electrical connections to each of the conductive layer of the staircase structure on the back side of the substrate. An example of the conductive layers are depicted in FIG. 13.

At process step 1555, various metal contacts can be formed for memory arrays and peripheral devices. Back-end-of-line processes can be resumed with metal interconnect lines to form a functional 3D NAND memory device. Examples of wirings between the metal interconnect lines and the gate electrodes of staircase structures are shown in FIGS. 14A, 14B and 14C.

In some embodiments, the peripheral devices can be formed on the first surface of the substrate. In some embodiments, the peripheral devices can be formed on the second surface of the substrate. In some embodiments, the peripheral devices can be formed on a different substrate and can be electrically connected with the memory strings and the staircase structures by wafer bonding or flip-chip bonding. In this example, interconnects between bit lines, word lines and peripheral circuits can be formed using interconnect structures, such as through-silicon-VIAs (TSVs) or through array contacts, etc.

Various embodiments in accordance with the present disclosure provide a 3D memory device with smaller die size, higher storage density, and improved performance compared with other 3D memory devices. By moving the staircase and contact structures to the back side of the substrate, the storage density of 3D memory devices can be increased. With more relaxed ground rules on the back side of the substrate, contact structures for each of the word lines can be designed with larger lateral dimensions, and therefore can reduce the high aspect ratio at contact hole etching and conductive material filling. Therefore, manufacturing yield for high density memory can be improved.

Accordingly, various embodiments of a three-dimensional memory device and methods of making the same are described in the present disclosure. In some embodiments, a three-dimensional memory device includes a semiconductor substrate and a plurality of through-substrate-trenches penetrating the semiconductor substrate. The 3D memory device also includes a film stack disposed on a first surface of the semiconductor substrate extending through the through-substrate-trenches to a second surface of the semiconductor substrate, wherein the film stack includes alternating conductive and dielectric layers. The 3D memory device also includes a staircase structure formed at an edge of the film stack.

In some embodiments, a method for forming a three-dimensional memory device includes disposing an insulating film on a first surface of a substrate, and forming a plurality of through-substrate-trenches extending through the insulating film and the substrate. The method also includes disposing a film stack of alternating conductive and dielectric layers on the first surface and a second surface of the substrate, wherein the first and second surfaces are on opposite sides of the substrate. The method further includes forming trench filling structures inside the through-substrate-trenches, and forming a staircase structure on an edge of the film stack on the second surface of the substrate. The method also includes disposing an insulating layer on the staircase structure, and forming a plurality of memory strings in the film stack on the first surface of the substrate. The method includes forming a plurality of first and second slit structures in the film stack on the first and second surfaces, respectively, to divide a memory block into a plurality of programmable and readable memory fingers. The method also includes forming contact structures on the conductive layers of the staircase structure.

The foregoing description of the specific embodiments will so fully reveal the general nature of the present disclosure that others can, by applying knowledge within the skill of the art, readily modify and/or adapt, for various applications, such specific embodiments, without undue experimentation, and without departing from the general concept of the present disclosure. Therefore, such adaptations and modifications are intended to be within the meaning and range of equivalents of the disclosed embodiments, based on the disclosure and guidance presented herein. It is to be understood that the phraseology or terminology herein is for the purpose of description and not of limitation, such that the terminology or phraseology of the present specification is to be interpreted by the skilled artisan in light of the disclosure and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections can set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A memory device, comprising:
a film stack of alternating conductive and dielectric layers disposed on both a first surface and a second surface of a substrate, wherein the first and second surfaces are on opposite sides of the substrate;
a plurality of memory strings formed in the film stack on the first surface of the substrate; and
a staircase structure formed in the film stack on the second surface of the substrate.

2. The memory device of claim 1, wherein the plurality of memory strings extend vertically through the film stack and are perpendicular to the first surface of the substrate.

3. The memory device of claim 1, further comprising:
peripheral devices formed on the first surface of the substrate.

4. The memory device of claim 1, further comprising:
peripheral devices formed on the second surface of the substrate.

5. The memory device of claim 1, further comprising:
peripheral devices formed on a second substrate that is different from the substrate, wherein the second substrate and the substrate are joined by wafer bonding or flip-chip bonding.

6. The memory device of claim 1, further comprising:
a through-substrate-trench penetrating through the substrate.

7. The memory device of claim 6, wherein the film stack on the first surface extends through the through-substrate-trench to the second surface.

8. The memory device of claim 7, wherein
the film stack on the first and second surfaces is stacked in a first direction perpendicular to the first and second surfaces of the substrate, respectively; and
the film stack inside the through-substrate-trench stacked is disposed in a second direction perpendicular to a sidewall of the through-substrate-trench.

9. The memory device of claim 6, wherein the through-substrate-trench comprises a trench filling structure, the trench filling structure comprising an insulator.

10. The memory device of claim 1, wherein the staircase structure is formed at one lateral edge of the film stack on the second surface of the substrate.

11. The memory device of claim 1, wherein the staircase structure is formed at two lateral edges of the film stack on the second surface of the substrate.

12. The memory device of claim 1, further comprising:
a plurality of contact structures formed in an insulating layer over the staircase structure, wherein the plurality of contact structures are configured to be electrically connected to the conductive layers of the film stack.

13. A method for forming a three-dimensional memory device, comprising:
forming a through-substrate-trench penetrating through a substrate;
disposing a film stack of alternating conductive and dielectric layers on both a first surface and a second surface of the substrate, wherein the first and second surfaces are on opposite sides of the substrate;
forming a staircase structure in the film stack on the second surface of the substrate; and
forming a plurality of memory strings in the film stack on the first surface of the substrate.

14. The method of claim 13, wherein the disposing of the film stack further comprises disposing the alternating conductive and dielectric layers inside the through-substrate-trench.

15. The method of claim 13, further comprising:
forming a first slit structure in the film stack on the first surface of the substrate; and
forming a second slit structure in the film stack on the second surface of the substrate.

16. The method of claim 15, wherein the forming of the first and second slit structures comprises:
etching the film stack on the first and second surfaces of the substrate to form a first slit opening and a second slit opening, respectively;
disposing a slit filling material in the first and second slit openings; and
forming coplanar surfaces between the slit filling material and the film stack on the first and second surfaces.

17. The method of claim 16, wherein disposing the slit filling material comprises disposing silicon oxide, silicon oxynitride, silicon nitride, or a combination thereof.

18. The method of claim 13, further comprising:
prior to forming the through-substrate-trench, disposing an insulating film on the first surface of the substrate.

19. The method of claim 13, further comprising:
after forming the through-substrate-trench, forming a trench filling structure inside the through-substrate-trench.

20. The method of claim 13, further comprising:
after forming the plurality of memory strings, disposing an insulating layer on the staircase structure; and
forming a plurality of contact structures on the conductive layers of the film stack.

* * * * *